(12) United States Patent
Kim et al.

(10) Patent No.: US 9,099,473 B2
(45) Date of Patent: Aug. 4, 2015

(54) SEMICONDUCTOR DEVICES INCLUDING METAL-SILICON-NITRIDE PATTERNS

(71) Applicants: Taekjung Kim, Seoul (KR); Myung-Ho Kong, Hwaseong-si (KR); Heesook Park, Hwaseong-si (KR); Youngwook Park, Osan-si (KR); Mansug Kang, Suwon-si (KR); Seonghwee Cheong, Seoul (KR)

(72) Inventors: Taekjung Kim, Seoul (KR); Myung-Ho Kong, Hwaseong-si (KR); Heesook Park, Hwaseong-si (KR); Youngwook Park, Osan-si (KR); Mansug Kang, Suwon-si (KR); Seonghwee Cheong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 13/796,449

(22) Filed: Mar. 12, 2013

(65) Prior Publication Data
US 2014/0054775 A1 Feb. 27, 2014

(30) Foreign Application Priority Data
Aug. 27, 2012 (KR) .................. 10-2012-0093855

(51) Int. Cl.
| | |
|---|---|
| H01L 23/48 | (2006.01) |
| H01L 23/532 | (2006.01) |
| H01L 27/108 | (2006.01) |
| H01L 27/22 | (2006.01) |
| H01L 49/02 | (2006.01) |
| H01L 29/66 | (2006.01) |
| H01L 29/78 | (2006.01) |
| H01L 29/417 | (2006.01) |
| H01L 29/423 | (2006.01) |

(52) U.S. Cl.
CPC .... *H01L 23/53266* (2013.01); *H01L 27/10817* (2013.01); *H01L 27/10876* (2013.01); *H01L 27/10885* (2013.01); *H01L 27/10894* (2013.01); *H01L 27/228* (2013.01); *H01L 28/91* (2013.01); *H01L 29/66666* (2013.01); *H01L 29/7827* (2013.01); *H01L 29/41766* (2013.01); *H01L 29/42356* (2013.01); *H01L 2924/0002* (2013.01)

(58) Field of Classification Search
CPC ..................... H01L 23/53266; H01L 29/7827; H01L 27/10876; H01L 27/10885; H01L 27/10894
See application file for complete search history.

(56) References Cited

U.S. PATENT DOCUMENTS

| | | | |
|---|---|---|---|
| 7,153,773 B2 | 12/2006 | Otsuki et al. | |
| 7,279,416 B2 | 10/2007 | Seo et al. | |
| 7,768,076 B2 | 8/2010 | Nakajima | |
| 7,943,978 B2 | 5/2011 | Kim et al. | |
| 8,043,923 B2 | 10/2011 | Kim et al. | |

(Continued)

FOREIGN PATENT DOCUMENTS

KR    1020010057528    *  4/2001

(Continued)

*Primary Examiner* — Daniel Whalen
(74) *Attorney, Agent, or Firm* — Myers Bigel Sibley & Sajovec, P.A.

(57) ABSTRACT

A semiconductor memory device can include a first conductive line crossing over a field isolation region and crossing over an active region of the device, where the first conductive line can include a first conductive pattern being doped, a second conductive pattern, and a metal-silicon-nitride pattern between the first and second conductive patterns and can be configured to provide a contact at a lower boundary of the metal-silicon-nitride pattern with the first conductive pattern and configured to provide a diffusion barrier at an upper boundary of the metal-silicon-nitride pattern with the second conductive pattern.

25 Claims, 44 Drawing Sheets

(56) References Cited

U.S. PATENT DOCUMENTS

2005/0095779 A1* 5/2005 Park et al. .................. 438/238
2008/0266927 A1* 10/2008 Lee et al. ...................... 365/63
2010/0085800 A1   4/2010 Yeom
2010/0151681 A1* 6/2010 Knapp et al. ............... 438/680
2012/0074518 A1* 3/2012 Kim et al. ................... 257/506

FOREIGN PATENT DOCUMENTS

| KR | 1020010057528 | 7/2001 |
| KR | 100744108 | 7/2007 |
| KR | 1020080082132 | 9/2008 |
| KR | 1020080082132 | * 11/2008 |

* cited by examiner

SEMICONDUCTOR DEVICES INCLUDING METAL-SILICON-NITRIDE PATTERNS

CROSS-REFERENCE TO RELATED APPLICATIONS

This U.S. non-provisional patent application claims priority under 35 U.S.C. §119 to Korean Patent Application No. 10-2012-0093855, filed on Aug. 27, 2012, the entirety of which is incorporated by reference herein.

BACKGROUND

The inventive concept relates to the field of semiconductors, and methods of forming the same.

The widths and spacing of patterns in the semiconductor devices have been reduced to provide high levels of integration. New exposure techniques and/or high cost exposure techniques may be needed for fine patterns, as it may be difficult to achieve higher levels of integration.

SUMMARY

Embodiments according to the present inventive concept can provide semiconductor devices including metal-silicon-nitride patterns and methods of forming the same. Pursuant to these embodiments, a semiconductor memory device can include a first conductive line crossing over a field isolation region and crossing over an active region of the device, where the first conductive line can include a first conductive pattern being doped, a second conductive pattern, and a metal-silicon-nitride pattern between the first and second conductive patterns and can be configured to provide a contact at a lower boundary of the metal-silicon-nitride pattern with the first conductive pattern and configured to provide a diffusion barrier at an upper boundary of the metal-silicon-nitride pattern with the second conductive pattern.

In some embodiments according to the present inventive concept, the first conductive line crosses over the field isolation region and over the active region in a cell array region of the device, where the device can further include a second conductive line that crosses over a field isolation region and over an active region in a peripheral region of the device, where the second conductive line can include a third conductive pattern being doped, and a fourth second conductive pattern, and a metal-silicon-nitride pattern between the third and fourth conductive patterns and can be configured to provide a contact at a lower boundary of the metal-silicon-nitride pattern with the third conductive pattern and a diffusion barrier at an upper boundary of the metal-silicon-nitride pattern with the fourth conductive pattern in the peripheral region.

In some embodiments according to the present inventive concept, the first conductive line can include a bit line and the second conductive line can include a peripheral gate structure. In some embodiments according to the present inventive concept, the metal-silicon-nitride pattern can include a metal silicide comprising the contact. In some embodiments according to the present inventive concept, the contact can include an ohmic contact.

In some embodiments according to the present inventive concept, the metal-silicon-nitride pattern can include a total thickness of about 30 Angstroms to about 70 Angstroms and the first conductive pattern comprises a total thickness of about 200 Angstroms to about 400 Angstroms. In some embodiments according to the present inventive concept, the first conductive line can include a total thickness less than about 800 Angstroms. In some embodiments according to the present inventive concept, the total thickness of the first conductive line is greater than about 550 Angstroms. In some embodiments according to the present inventive concept, the total thickness of the first conductive pattern is about 350 Angstroms. In some embodiments according to the present inventive concept, the second conductive pattern includes a total thickness of about 300 Angstroms.

In some embodiments according to the present inventive concept, the metal-silicon-nitride pattern can include a total thickness of about 10% to about 25% of a total thickness of the first conductive pattern. In some embodiments according to the present inventive concept, a total thickness of the metal-silicon-nitride pattern is less than a total thickness of the second conductive pattern, which is less than a total thickness of the first conductive pattern.

In some embodiments according to the present inventive concept, the metal-silicon-nitride pattern can include a silicon concentration of at least about 10 atm % measured over a total thickness of the metal-silicon-nitride pattern. In some embodiments according to the present inventive concept, the silicon concentration can include a first concentration of about 10 atm % to about 30 atm % measured adjacent the upper boundary and can include a second concentration of about 30 atm % to about 50 atm % measured adjacent the lower boundary. In some embodiments according to the present inventive concept, the silicon concentration changes from the first concentration to the second concentration throughout the metal-silicon-nitride pattern.

In some embodiments according to the present inventive concept, the metal-silicon-nitride pattern can include silicon-nitride layers interspersed with metal-nitride layers. In some embodiments according to the present inventive concept, the metal-silicon-nitride pattern can include a TiSiN pattern. In some embodiments according to the present inventive concept, the TiSiN pattern can include SiN layers interspersed with TiN layers.

In some embodiments according to the present inventive concept, a crystal grain size included in the metal-silicon-nitride pattern can include about 10% or less of a crystal grain size included in the second conductive pattern. In some embodiments according to the present inventive concept, a crystal structure in the metal-silicon-nitride pattern can include a fine crystal structure including fine metal-nitride sub-grains having spaces therebetween and silicon-nitride in the spaces.

In some embodiments according to the present inventive concept, the semiconductor memory device can include a DRAM and the first conductive line comprises a bit line included in a BCAT in a cell array region of the DRAM. In some embodiments according to the present inventive concept, the semiconductor memory device can include an MRAM. In some embodiments according to the present inventive concept, the semiconductor memory device can include a vertical channel DRAM.

In some embodiments according to the present inventive concept, a semiconductor memory device can include a peripheral gate structure that crosses over an active region and that crosses over a device isolation region in a peripheral region of the device, where the peripheral gate structure can include a first conductive pattern being doped, a second conductive pattern, and a metal-silicon-nitride pattern between the first and second conductive patterns and configured to provide a contact at a lower boundary of the metal-silicon-nitride pattern with the first conductive pattern and a diffusion barrier at an upper boundary of the metal-silicon-nitride pattern with the second conductive pattern.

In some embodiments according to the present inventive concept, a DRAM device can include a substrate including device isolation regions defining active regions in the substrate. First dopant regions can be in the active regions of the substrate located between pairs of second dopant regions in the active regions of the substrate. Buried cell gate structures can be in a cell array region of the substrate between the pairs of the second dopant regions, where the buried cell gate structures are separated from one another by the first dopant regions. An interlayer insulating layer can be on the substrate. A bit line, can be in the interlayer insulating layer on the first dopant regions, where the bit line includes a first conductive pattern being doped, a second conductive pattern, and a metal-silicon-nitride pattern between the first and second conductive patterns, where the metal-silicon-nitride pattern can be configured to provide a contact at a lower boundary of the metal-silicon-nitride pattern with the first conductive pattern and configured to provide a diffusion barrier at an upper boundary of the metal-silicon-nitride pattern with the second conductive pattern. Lower electrodes can be on the interlayer insulating layer and contacts can be extending from the lower electrodes through the interlayer insulating layer to the second dopant regions. Upper electrodes can be on the lower electrodes and an insulating layer can be between the upper and lower electrodes.

In some embodiments according to the present inventive concept, a conductive line in a memory device can include a doped polysilicon layer. A TiSiN layer can be on the doped polysilicon layer and a Tungsten layer can be on the TiSiN layer. In some embodiments according to the present inventive concept, the conductive line can further include a tungsten silicide between the TiSiN layer and the Tungsten layer. In some embodiments according to the present inventive concept, the TiSiN layer can include a total thickness of about 30 Angstroms to about 70 Angstroms and the doped polysilicon layer can include a total thickness of about 200 Angstroms to about 400 Angstroms.

In some embodiments according to the present inventive concept, a method of forming semiconductor memory device can include forming a first conductive pattern being doped as part of a conductive line in a cell array region of substrate. A second conductive pattern being doped, can be formed, as part of a peripheral gate structure in a peripheral region of substrate. A first metal-silicon-nitride pattern can be simultaneously formed on the first conductive pattern in the conductive line and a second metal-silicon-nitride pattern on the first conductive pattern in the peripheral gate structure. A third conductive pattern can be formed on the first metal-silicon-nitride pattern. A fourth conductive pattern can be formed on the second metal-silicon-nitride pattern.

BRIEF DESCRIPTION OF THE DRAWINGS

FIGS. 2A to 13A are cross-sectional views taken along lines A-A' and B-B' of FIG. 1 illustrating methods of forming semiconductor devices according to embodiments of the inventive concept.

FIGS. 2B to 13B are cross-sectional views taken along a line C-C' of FIG. 1 illustrating methods of forming semiconductor devices according to embodiments of the inventive concept.

FIGS. 14A to 17A are cross-sectional views taken along lines A-A' and B-B' of FIG. 1 to illustrate methods of forming semiconductor devices according to embodiments of the inventive concept.

FIGS. 14B to 17B are cross-sectional views taken along a line C-C' of FIG. 1 illustrating methods of forming semiconductor devices according to embodiments of the inventive concept.

FIGS. 19A to 24A are cross-sectional views taken along a line G-G' of FIG. 18 illustrating methods of forming semiconductor devices according to embodiments of the inventive concept.

FIGS. 19B to 24B are cross-sectional views taken along lines H-H' and I-I' of FIG. 18 illustrating methods of forming semiconductor devices according to embodiments of the inventive concept.

FIGS. 26A to 36A are cross-sectional views taken along a line D-D' of FIG. 25 illustrating methods of forming semiconductor devices according to embodiments of the inventive concept.

FIGS. 26B to 36B are cross-sectional views taken along lines E-E' and F-F' of FIG. 25 illustrating methods of forming semiconductor devices according to embodiments of the inventive concept.

DETAILED DESCRIPTION OF THE EMBODIMENTS

Figure 1:
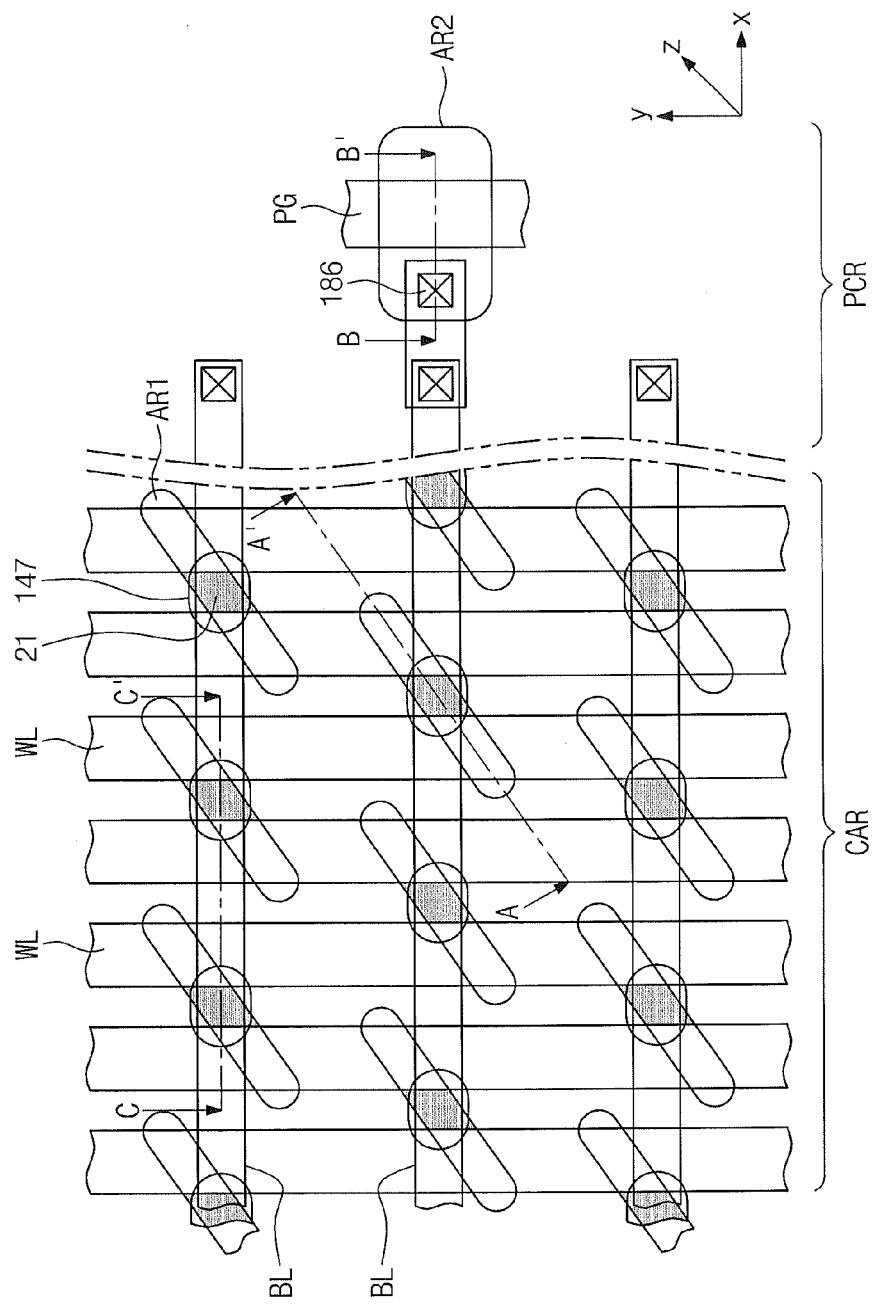
FIG. 1 is a plan view illustrating a semiconductor device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. As used herein, the term "total thickness" refers to a thickness of a layer or region measured from, for example, one surface of the layer or region to an opposing surface of the same layer or region. Further, the surfaces used to measure the total thickness may form boundaries with other regions or layers which are in direct contact with the layer or region having the total thickness.

FIG. 1 is a plan view illustrating a semiconductor device according to embodiments of the inventive concept. FIGS. 2A to 13A are cross-sectional views taken along lines A-A' and B-B' of FIG. 1 illustrating methods of forming semiconductor devices according to embodiments of the inventive concept. FIGS. 2B to 13B are cross-sectional views taken along a line C-C' of FIG. 1 illustrating methods of forming semiconductor devices according to embodiments of the inventive concept.

Figure 2A:
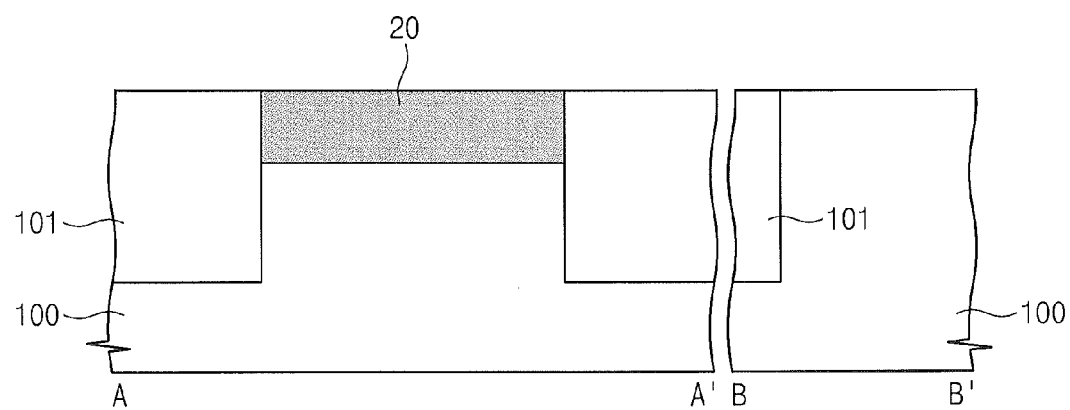
Figure 2B:
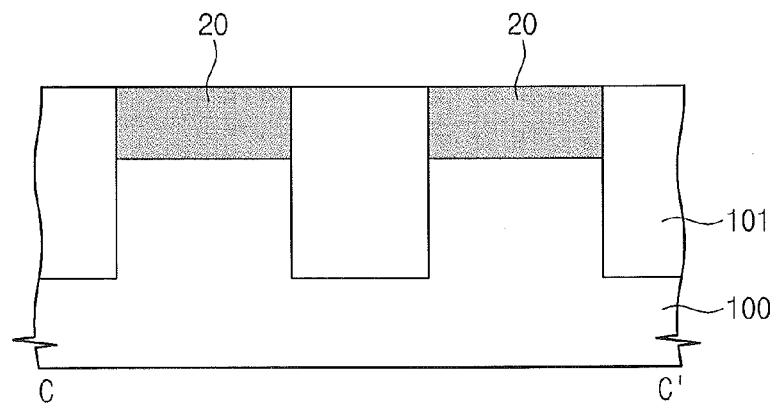

Referring to FIGS. 1, 2A, and 2B, field isolation layers 101 may be formed in a substrate 100 to define first active regions AR1 in a cell array region CAR and a second active region AR2 in a peripheral circuit region PCR. The substrate 100 may be a semiconductor substrate formed of, for example, silicon, germanium, or a silicon-germanium. The first active regions AR1 may be bar-shaped (i.e., rectangular) spaced apart from each other in a plan view. In FIG. 1, an x-axis direction may correspond to a first direction, and a y-axis direction may correspond to a second direction. Each of the first active regions AR1 may extend in a third direction, i.e. z-axis direction non-perpendicular (or oblique) to both the first and second directions in a plan view. Hereinafter, the first direction is referred to as the x-axis direction, the second direction is referred to as the y-axis direction, and the third direction is referred to as the z-axis direction. The x-axis direction and the y-axis direction may cross each other.

A dopant region 20 may be formed in an upper portion of each of the first active regions AR1. Dopant ions of a conductivity type different from that of the substrate 100 may be implanted into an upper portion of the substrate 100 to form the dopant region 20. The dopant region 20 may be formed after or before the formation of the field isolation layers 101. In some embodiments, the dopant region 20 may be formed after the present step.

Figure 3A:
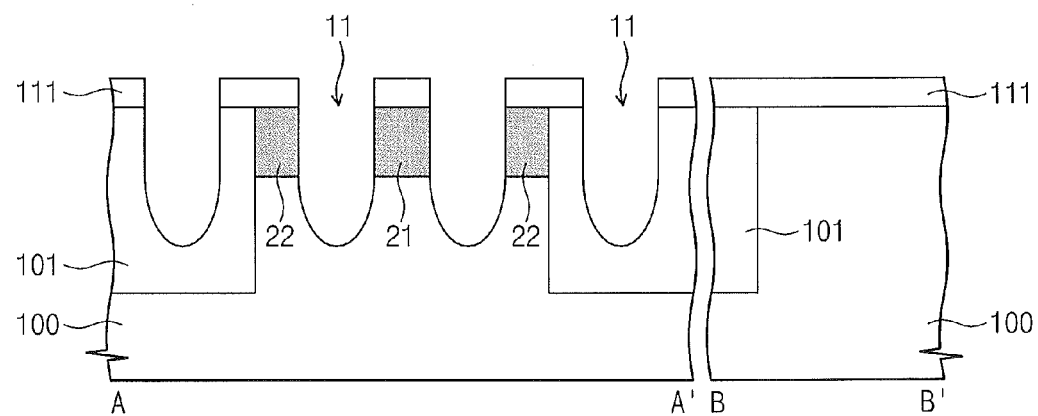
Figure 3B:
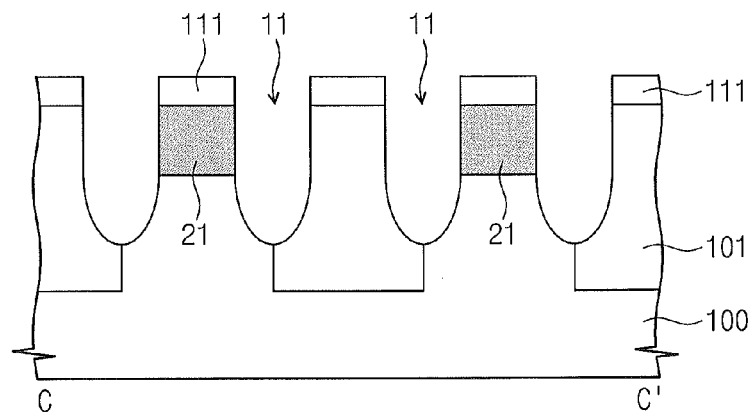

Referring to FIGS. 1, 3A, and 3B, trenches 11 may be formed in an upper portion of the substrate 100 of the cell array region CAR. The trenches 11 may extend in the y-axis direction and be formed spaced apart from each other in the x-axis direction. Due to the formation of the trenches 11, the dopant region 20 in each of the first active regions AR1 may be divided into a first dopant region 21 and a second dopant region 22. For example, the first dopant region 21 and a pair of the second dopant regions 22 may be disposed in each of the first active regions AR1. The first dopant region 21 may be disposed between a pair of the second dopant regions 22 in each of the first active regions, and the first dopant region 21 and the pair of the second dopant regions 22 may be spaced apart from each other by the trenches 11.

A mask pattern 111 may be formed on the substrate 100 and then a dry and/or wet etching process, using the mask pattern 111 as an etch mask, may be performed to form the trenches 11. For example, the mask pattern 111 may include at least one of a photoresist, silicon nitride, and silicon oxide. A depth of each of the trenches 11 may be less than that of the field isolation layer 101.

Figure 4A:
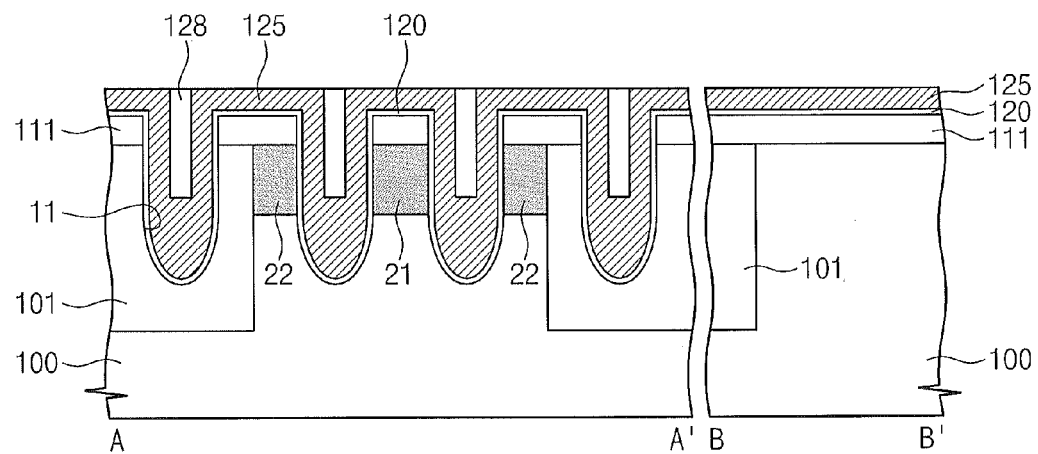
Figure 4B:
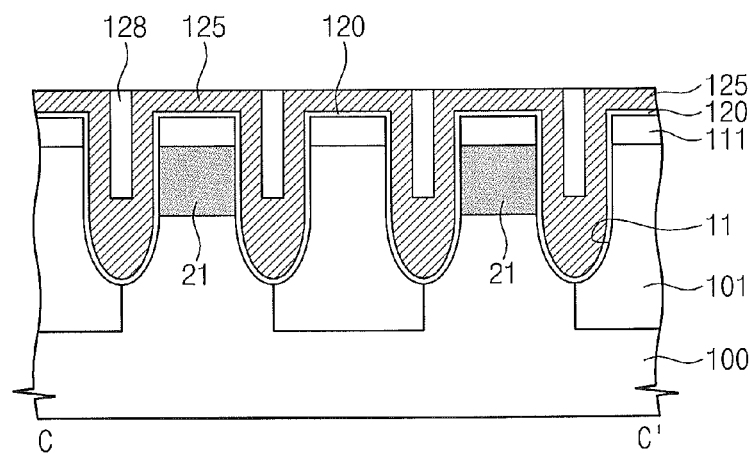

Referring to FIGS. 1, 4A, and 4B, a first insulating layer 120, a conductive layer 125, and a filling layer 128 may be sequentially formed on the substrate 100 having the trenches 11. After the first insulating layer 120 and the conductive layer 125 are formed in the trenches 11, the filling layer 128 may be formed to fill the trenches 11. The filling layer 128 may be provided by forming an insulating layer on the conductive layer 125, and performing a planarization process on the insulating layer.

In some embodiments, the first insulating layer 120 may include at least one of a silicon oxide layer, a silicon nitride layer, and a silicon oxynitride layer. The conductive layer 125 may include at least one of a doped semiconductor material, a conductive metal nitride, a metal, and a metal-semiconductor compound. The filling layer 128 may include at least one of a silicon oxide layer, a silicon nitride layer, and a silicon oxynitride layer. Each of the first insulating layer 120, the conductive layer 125, and the filling layer 128 may be formed by at least one of a chemical vapor deposition (CVD) process, a physical vapor deposition (PVD) process, and an atomic layer deposition (ALD) process.

Figure 5A:
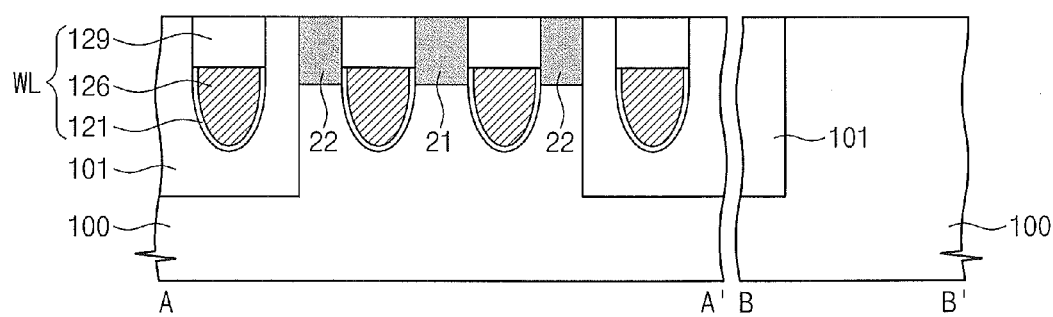
Figure 5B:
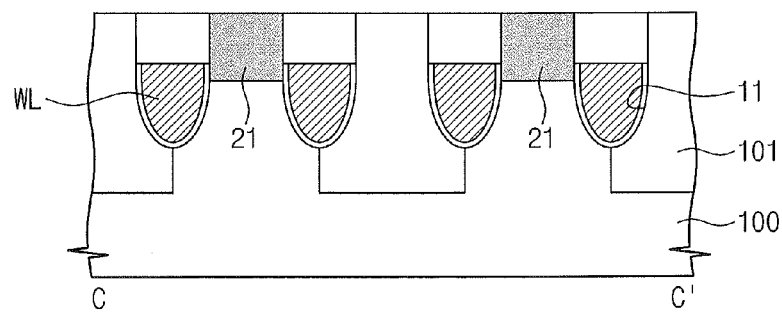

Referring to FIGS. 1, 5A, and 5B, the conductive layer 125 and the first insulating layer 120 may be successively etched. Due to the etching process, the first insulating layer 120 may be divided into gate insulating layers 121 that are separated from each other, and the conductive layer 125 may be divided into gate electrodes 126 that are separated from each other. The gate insulating layers 121 and the gate electrodes 126 may be confined within the trenches 11. The etching of the conductive layer 125 and the first insulating layer 120 may be performed until the filling layer 128 is removed from within the trenches 11, such that top ends of the gate insulating layers 121 and top surfaces of the gate electrodes 126 may be lower than top surface of the substrate 100 (i.e., recessed within the openings of the trenches 11).

Gate capping patterns 129 may be formed on the gate electrodes 126, respectively. In some embodiments according to the invention, the remaining regions of the trenches 11 on the gate electrodes 126 may be filled with an insulating layer and then the insulating layer may be planarized until the top surface of the substrate 100 is exposed, so that the gate capping patterns 129 may be formed in the trenches 11. The gate capping patterns 129 may include at least one of a silicon nitride layer, a silicon oxide layer, and a silicon oxynitride layer. The gate capping patterns are formed, so that cell gate structures may be formed in the trenches 11. Each of the cell gate structures may include the gate insulating layer 121, the gate electrode 126, and the gate capping pattern 129 which are sequentially stacked in each of the trenches 11. The cell gate structures may provide word lines WL for the semiconductor device.

Figure 6A:
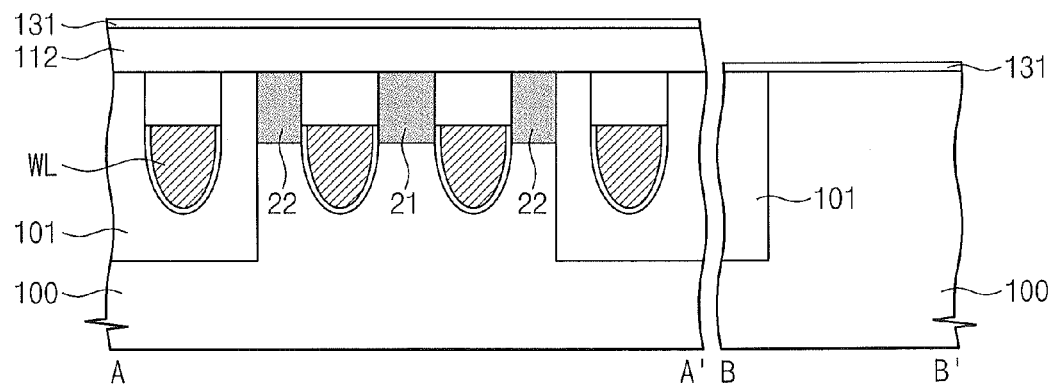
Figure 6B:
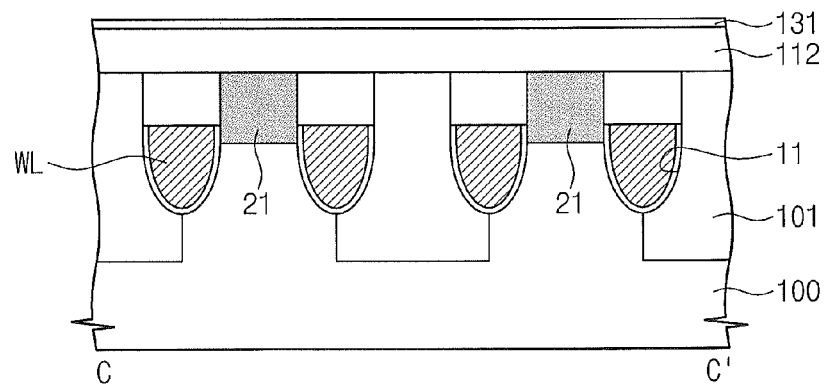

Referring to FIGS. 1, 6A, and 6B, a mask pattern 112 may be formed to cover the cell array region CAR. The mask pattern 112 may not cover the peripheral circuit region PCR. A second insulating layer 131 may be formed on the peripheral circuit region PCR and on the mask pattern 112 in the CAR. The second insulating layer 131 may include at least one of silicon oxide, silicon oxynitride, and high-k dielectric layer having a dielectric constant that is greater than silicon oxide. In some embodiments, the mask pattern 112 may include at least one of a photoresist, a silicon nitride layer, and a silicon oxide layer.

Figure 7A:
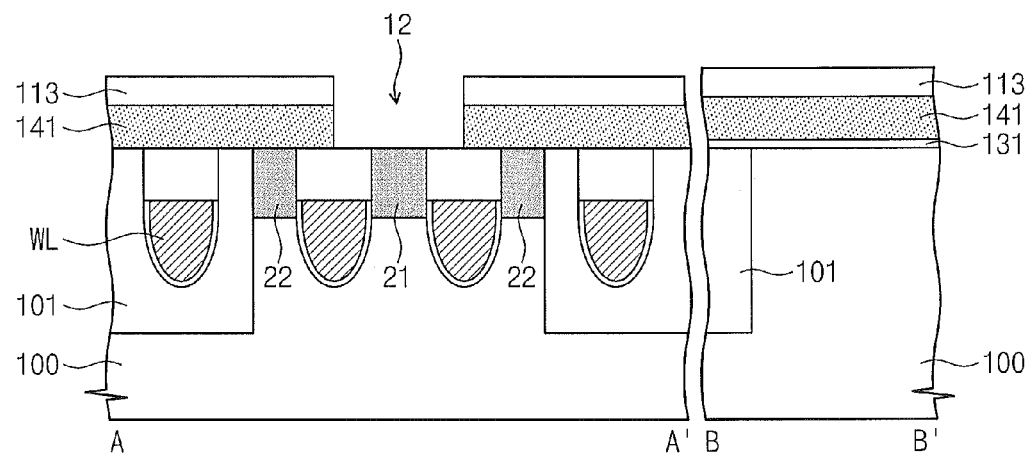
Figure 7B:
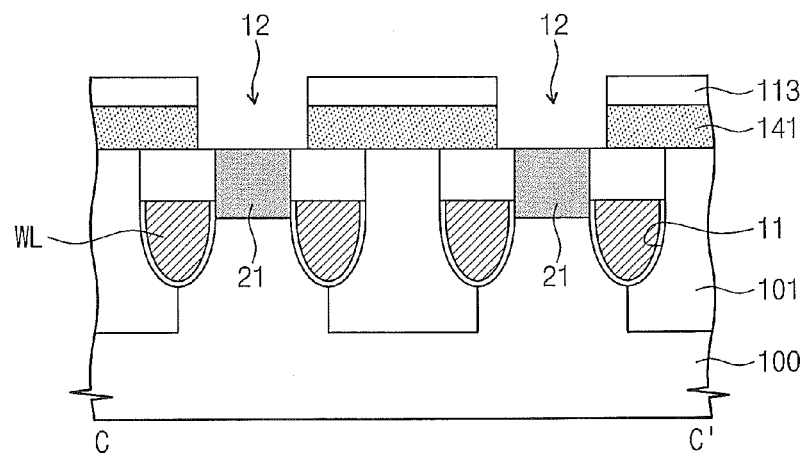

Referring to FIGS. 1, 7A, and 7B, the second insulating layer 131 and the mask pattern 112 of the cell array region CAR may be removed and then a first semiconductor layer 141 may be formed on the cell array region CAR and the peripheral circuit region PCR. In some embodiments, the first semiconductor layer 141 may be an undoped silicon layer. Through-holes 12 may be formed to penetrate the first semiconductor layer 141 to expose the first dopant regions 21, respectively. Each of the through-holes 12 may have a circular shape or an elliptic shape in a plan view. A mask pattern 113 may be formed on the first semiconductor layer 141 and then a dry and/or wet etching process, using the mask pattern 113, may be performed on the first semiconductor layer 141 to form the through-holes 12. FIGS. 7A and 7B show bottom surfaces of the through-holes 12 coplanar with a bottom surface of the first semiconductor layer 141. However, the inventive concept is not limited thereto. The bottom surfaces of the through-holes 12 may be lower than the bottom surface of the first semiconductor layer 141 due to over-etching of the etch process used to form the through-holes 12.

Figure 8A:
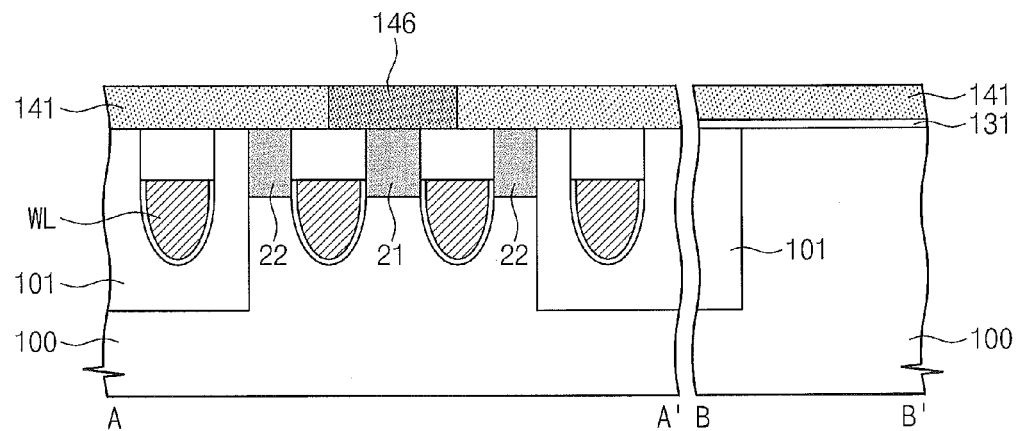
Figure 8B:
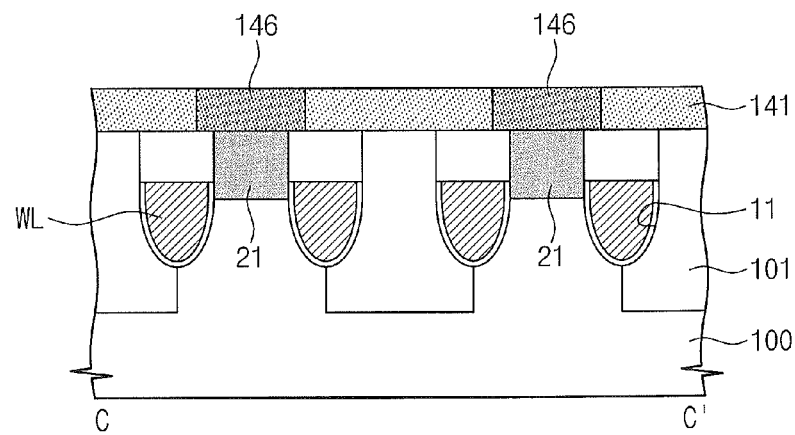

Referring to FIGS. 1, 8A and 8B, second semiconductor patterns 146 may be formed to fill the through-holes 12. In some embodiments, the second semiconductor patterns 146 may be formed of silicon doped with dopants. After the mask pattern 113 is removed, a second semiconductor layer may be formed to fill the through-holes 12. The second semiconductor layer may be planarized to form the second semiconductor patterns 146. The second semiconductor patterns 146 may be doped with the same dopants as the first dopant regions 21 in-situ.

Figure 9A:
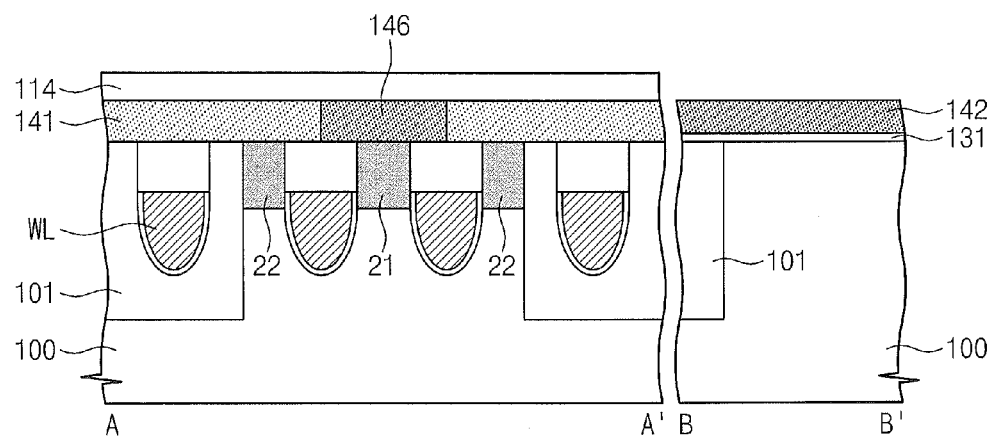
Figure 9B:
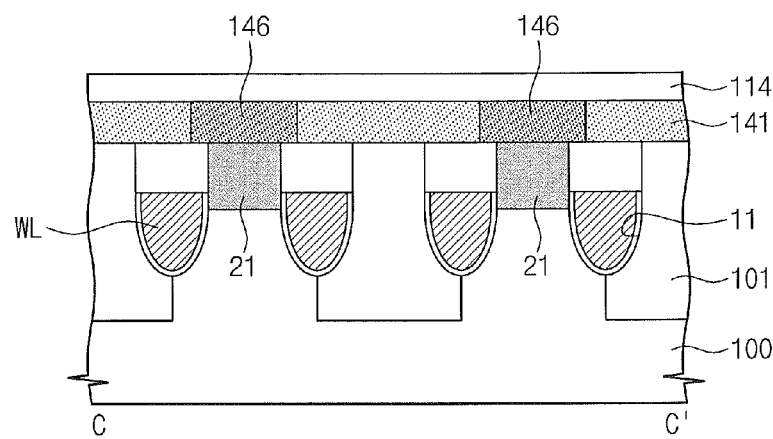

Referring to FIGS. 1, 9A, and 9B, a mask pattern 114 may be formed to cover the cell array region CAR and expose the PCR, and then a dopant ion implantation process may be performed on the first semiconductor layer 141 on the peripheral circuit region PCR. If a transistor of the peripheral circuit region PCR is a PMOS transistor, the first semiconductor layer 142 may be implanted with p-type dopants. If the transistor of the peripheral circuit region PCR is an NMOS transistor, the first semiconductor layer 142 may be implanted with n-type dopants. However, the inventive concept is not limited thereto.

Figure 10A:
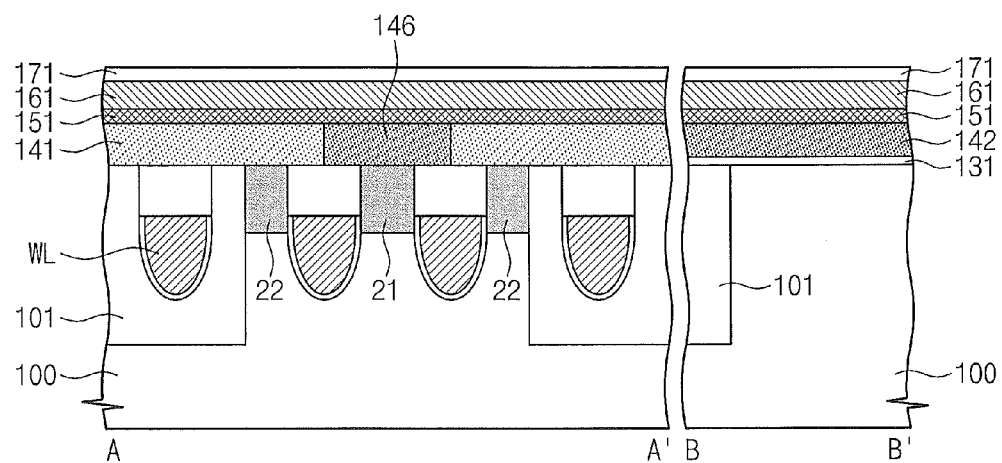
Figure 10B:
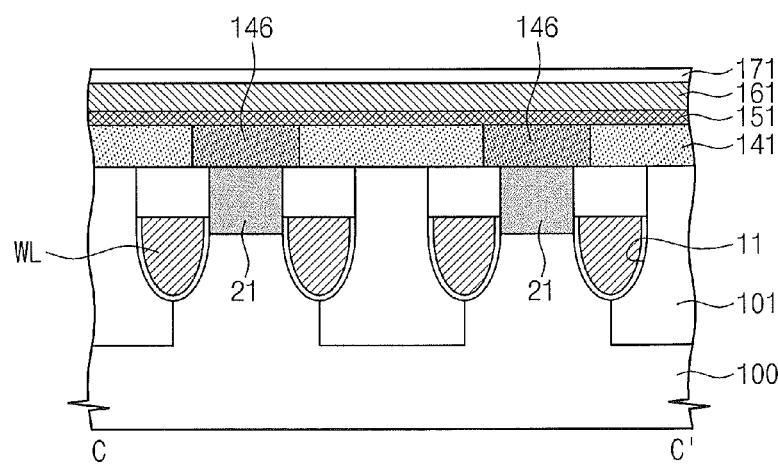
Figure 10C:
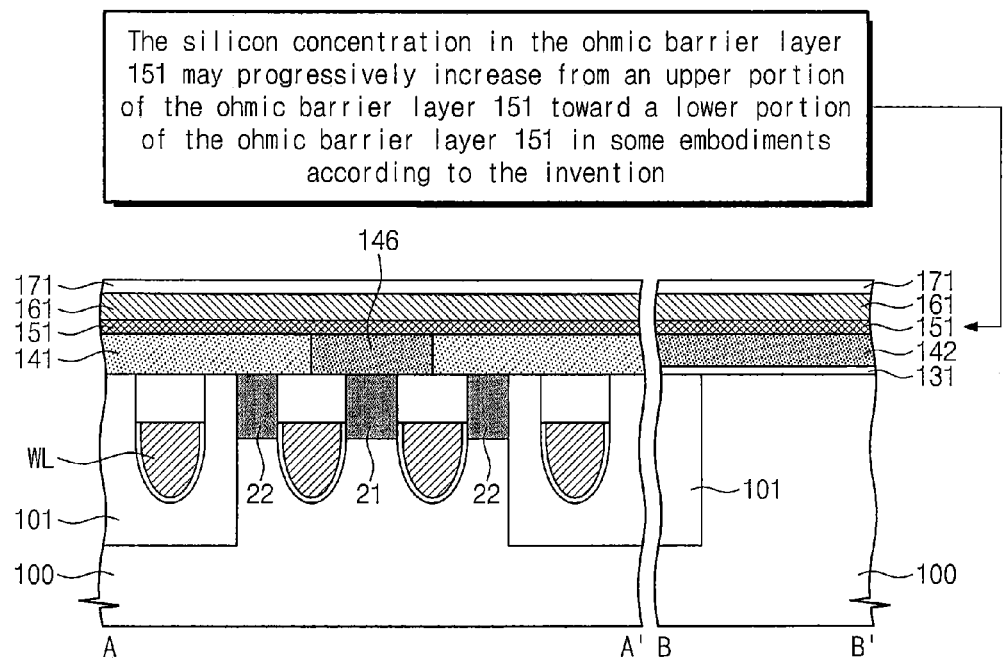
FIG. 10C is a cross-sectional view taken along lines A-A' and B-B' of FIG. 1 illustrating methods of forming semiconductor devices according to embodiments of the inventive concept.

Referring to FIGS. 1, 10A, and 10B, the mask pattern 114 may be removed. Subsequently, an ohmic barrier layer 151, a metal layer 161, and a capping layer 171 may be sequentially formed on the cell array region CAR and the peripheral circuit region PCR. The ohmic barrier layer 151 may include a metal-silicon nitride. In some embodiments, the metal-silicon nitride may include at least one of titanium-silicon nitride (TiSiN), tantalum-silicon nitride (TaSiN), and tungsten-silicon nitride (WSiN). In some embodiments, the ohmic barrier layer 151 may be formed by a CVD or ALD process using a source gas including $TiCl_4$, di-chlorosilane (DCS), and $NH_3$. For example, the process for forming ohmic barrier layer 151 may be performed at a temperature within a range of about 560° C. to about 680° C. In some embodiments, the source gas may include $SiH_4$ instead of DCS. A silicon concentration in the ohmic barrier layer 151 may be about 10 atm % or more. The silicon concentration in the ohmic barrier layer 151 may progressively increase from an upper portion of the ohmic barrier layer 151 toward a lower portion of the ohmic barrier layer 151 as illustrated in, for example, FIG. 10C in some embodiments according to the invention. For example, the silicon concentration of the upper portion of the ohmic barrier layer 151 may be within a range of about 10 atm % to about 30 atm %, and the silicon concentration of the lower portion of the ohmic barrier layer 151 may be within a range of about 30 atm % to about 50 atm %. The lower portion of the ohmic barrier layer 151 having the relatively high silicon concentration may provide for an ohmic contact between the ohmic barrier layer 151 and the second semiconductor patterns 146 and an ohmic contact of a boundary between the ohmic barrier layer 151 and the first semiconductor layer 142 implanted with the dopants on the peripheral circuit region PCR. The upper portion of the ohmic barrier layer 151 having the relatively low silicon concentration at the boundary therebetween, may prevent dopants from being diffused from the semiconductor layers 146 and 142 into the metal layer 161.

In some embodiments, if the ohmic barrier layer 151 is formed by the ALD process, TiN layers and SiN layers may be alternately and repeatedly formed. The TiN layer may be formed using a pulse of $TiCl_4$ and $NH_3$, and the SiN layer may be formed using a pulse of DCS and $NH_3$. In this case, the number of TiN cycles and the number of SiN cycles in one loop of the ALD process may be controlled, so that the silicon concentration of the ohmic barrier 151 may be controlled. In some embodiments, if the ohmic barrier layer 151 is formed by the CVD process, the silicon concentration of the ohmic barrier layer 151 may be controlled by controlling a flow rate of the DCS gas and/or a pressure in a chamber for the CVD process.

A size of a crystal grain of the ohmic barrier layer 151 may be relatively small. In some embodiments, an average size of the crystal grains of the ohmic barrier layer 151 may be equal to or less than a tenth of an average size of crystal grains of the metal layer 161. For example, an average diameter of the crystal grains of the ohmic barrier layer 151 may be equal to or less than 30 Å. In some embodiments, a crystal structure of the ohmic barrier layer 151 may include fine TiN sub-grains and SiN filled between the fine TiN sub-grains. The fine structures of the ohmic barrier layer 151 may increase a diffusion path of dopants from the semiconductor layers 146 and 142 to the metal layer 161. The ohmic barrier layer 151 may be formed to have a thickness within a range of about a tenth to about a quarter of a thickness of the second semiconductor pattern 146. In some embodiments, the thickness of the ohmic barrier layer 151 may be within a range of about 30 Å to about 70 Å, and the thickness of the second semiconductor pattern 146 may be within a range of about 200 Å to about 400 Å.

The metal layer 161 may include a metal and/or a conductive metal nitride. In some embodiments, the metal layer 161 may include at least one of tungsten (W), titanium, tantalum, and any nitrides thereof. The capping layer 171 may include at least one of silicon oxide, silicon nitride, and silicon oxynitride. Each of the metal layer 161 and the capping layer 171 may be formed of a sputtering process or a CVD process.

Figure 11A:
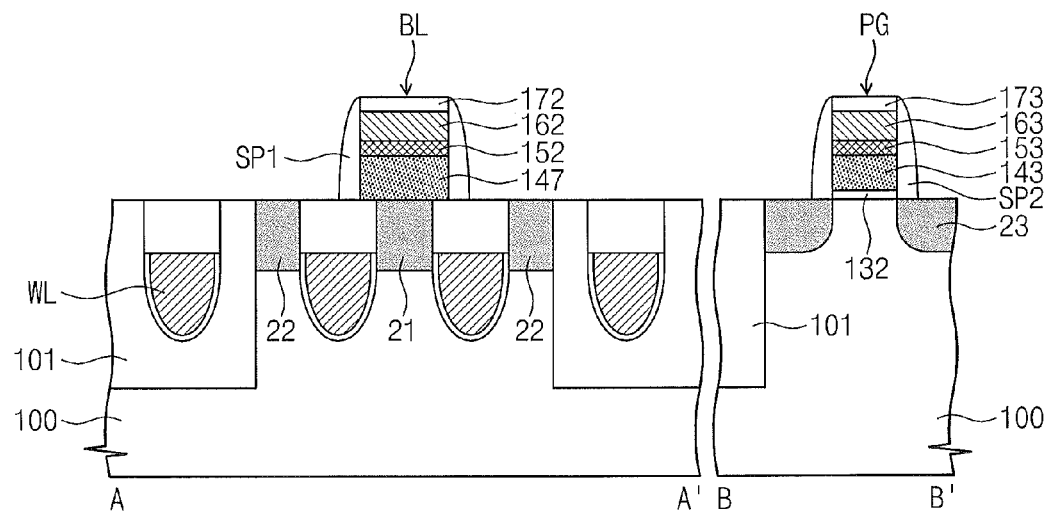
Figure 11B:
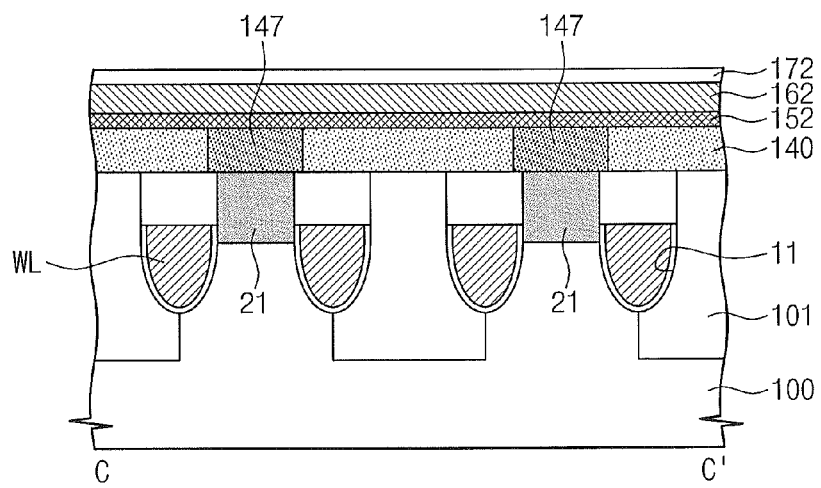

Referring to FIGS. 1, 11A, and 11B, the capping layer 171, the metal layer 161, the ohmic barrier layer 151, the first semiconductor layer 141 and 142, and the second semiconductor patterns 146 may be patterned to form conductive lines on the cell array region CAR and a peripheral gate structure PG on the peripheral circuit region PCR crossing over the field isolation regions 101 and crossing over the active regions AR1 and AR2. The conductive lines may provide bit lines BL of the semiconductor device. Each of the bit lines BL may include a plurality of first conductive patterns 147 respectively connected to the first dopant regions 21, an ohmic barrier pattern 152, a second conductive pattern 162, and a capping pattern 172. The ohmic barrier pattern 152, the second conductive pattern 162, and the capping pattern 172 may be sequentially stacked on the plurality of first conductive patterns 147.

The first semiconductor layer 141 on the cell array region CAR may be divided into first semiconductor patterns 140 spaced apart from each other. The first conductive patterns 147 may be disposed between the first semiconductor patterns 140. In other words, the first conductive patterns 147 and the first semiconductor patterns 140 in each of the bit lines BL may be alternately and repeatedly arranged in a longitudinal direction of each of the bit lines BL.

The peripheral gate structure PG may include a gate insulating layer 132, a first conductive pattern 143, an ohmic barrier pattern 153, a second conductive pattern 163, and a capping pattern 173 which are sequentially stacked on the substrate 100. A first spacer SP1 and a second spacer SP1 may be formed a sidewall of each of the bit lines BL and a sidewall of the peripheral gate structure PG, respectively. Third dopant regions 23 may be formed in the second active region AR2 at both sides of the peripheral gate structure PG. Dopant ions of the same conductivity type as the dopants of the first conductive pattern 143 may be implanted into the second active region AR2 to form the third dopant regions 23. When the third dopant regions 23 are formed, the cell array region CAR may be protected by a mask pattern, or the dopant ion implantation process for the third dopant regions 23 may also be performed on the second dopant region 22.

Figure 12A:
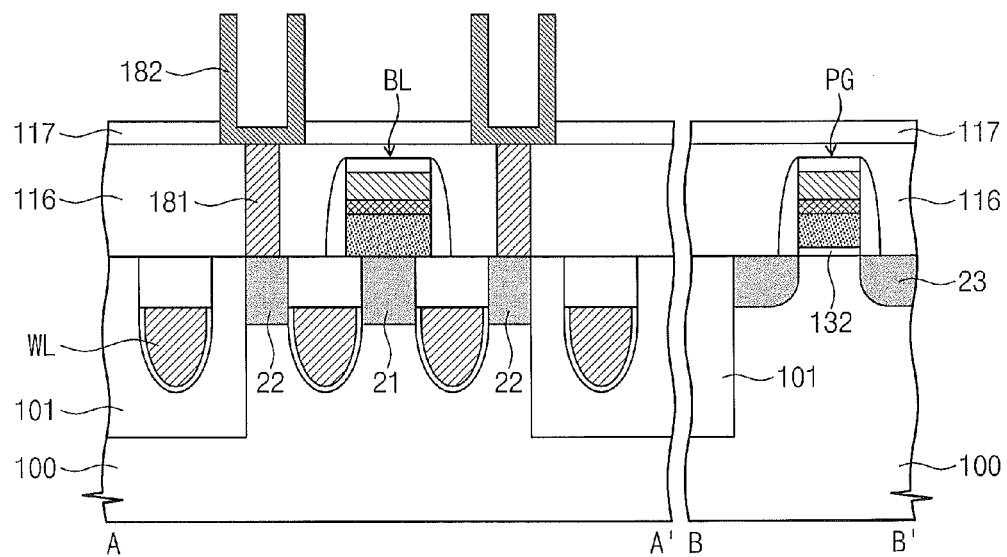
Figure 12B:
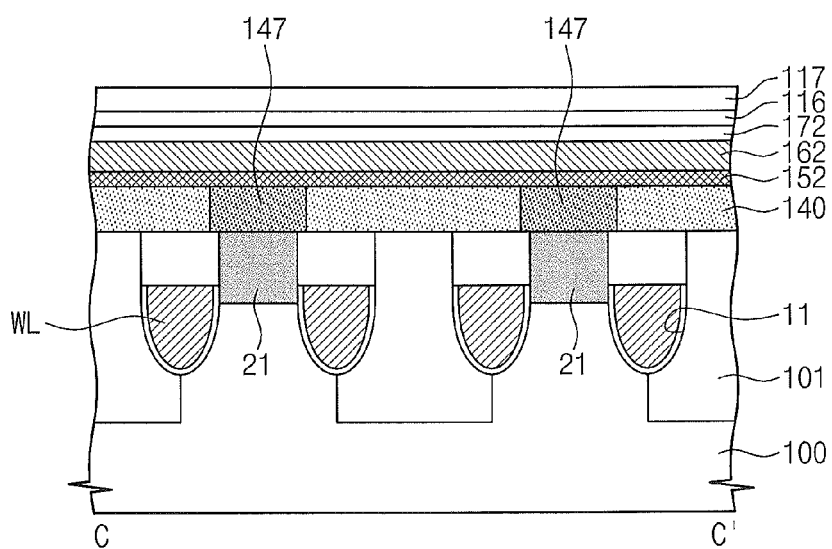

Referring to FIGS. 1, 12A, and 12B, a first interlayer insulating layer 116 may be formed to cover the bit lines BL and the peripheral gate structure PG, and then first contacts 181 may be formed to penetrate the first interlayer insulating layer 116. The first contacts 181 may be connected to the second dopant regions 22, respectively. A second interlayer insulating layer 117 may be formed to cover the first contacts 181, and then lower electrodes 182 may be formed to penetrate the second interlayer insulating layer 117. The lower electrodes 182 may be connected to the first contacts 181. In some embodiments, each of the lower electrodes 182 may have a hollow cylinder-shape of which a bottom end is closed. A sacrificial layer may be formed on the second interlayer insulating layer 117 and then guide holes may be formed in the sacrificial layer and the second insulating layer 117. The guide holes may expose the first contacts 181, respectively. A conductive layer may be conformally formed on the sacrificial layer having the guide holes and a filling layer may be formed on the conductive layer to fill the guide holes. The filling layer and the conductive layer may be planarized until the sacrificial layer is exposed. Thus, the lower electrode 182 and a filling pattern may be formed in each of the guide holes. Subsequently, the sacrificial layer and the filling patterns may be removed.

In some embodiments, the first contacts 181 and the lower electrodes 182 may be formed of at least one of a metal, a conductive metal compound, and a doped semiconductor. The interlayer insulating layers 116 and 117 may be formed of at least one of a silicon oxide layer, a silicon nitride layer, and a silicon oxynitride layer. The formation of the first contacts 181, the lower electrodes 182, and the interlayer insulating layers 116 and 117 may be provided by a sputtering process or a CVD process.

Figure 13A:
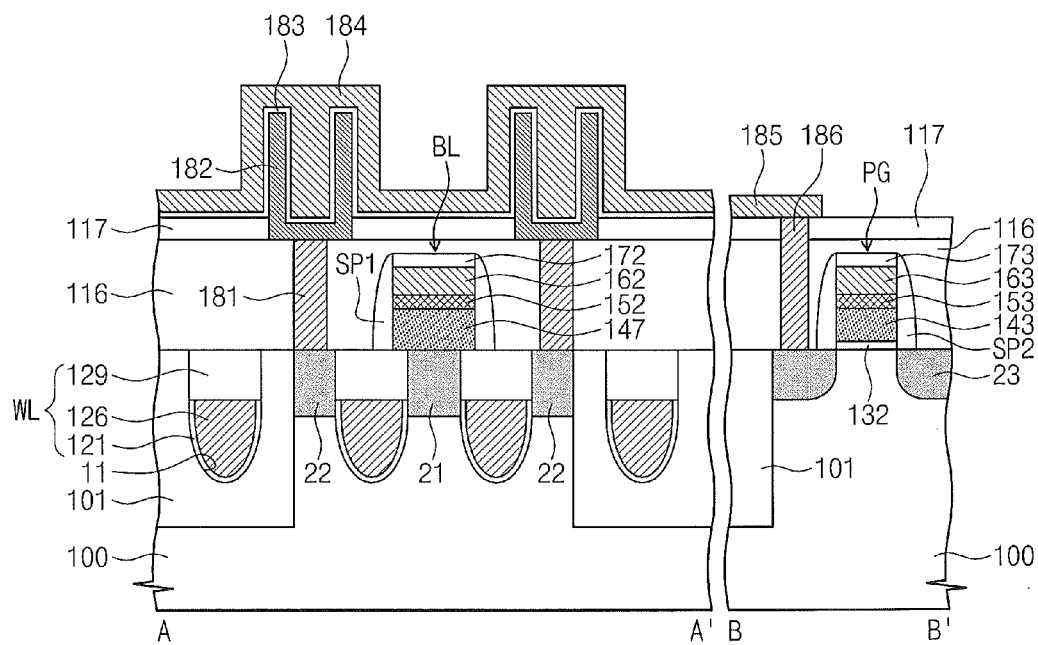
Figure 13B:
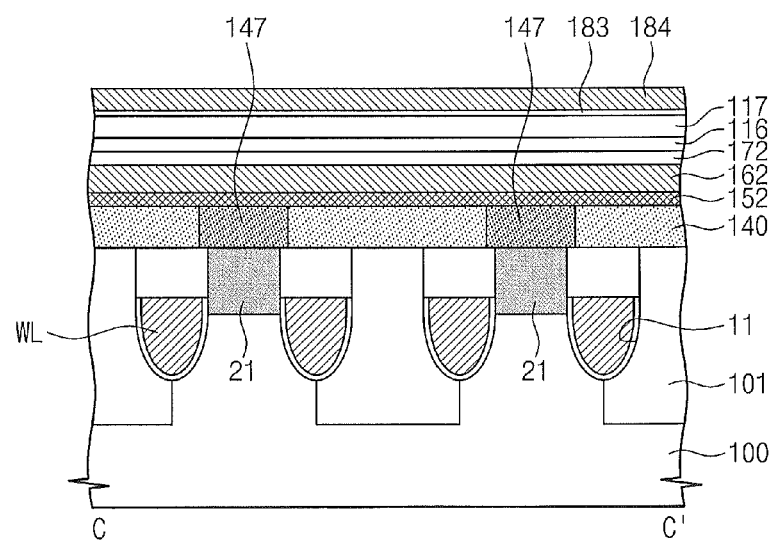
Figure 13C:
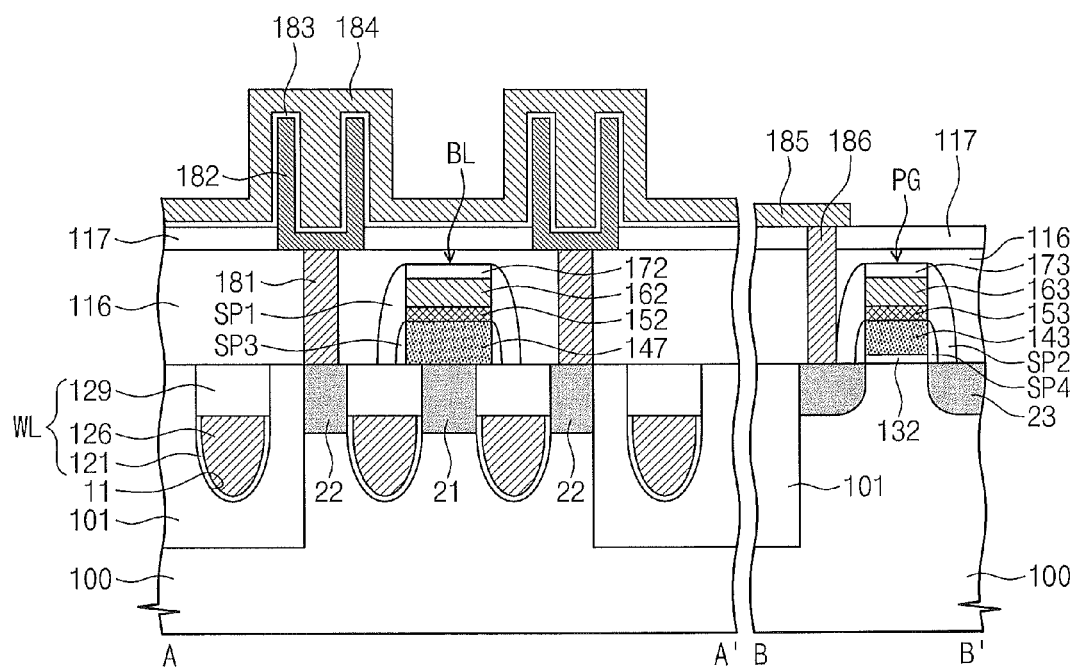
FIG. 13C is a cross-sectional view illustrating methods of forming semiconductor devices according to embodiments of the inventive concept.
Figure 13D:
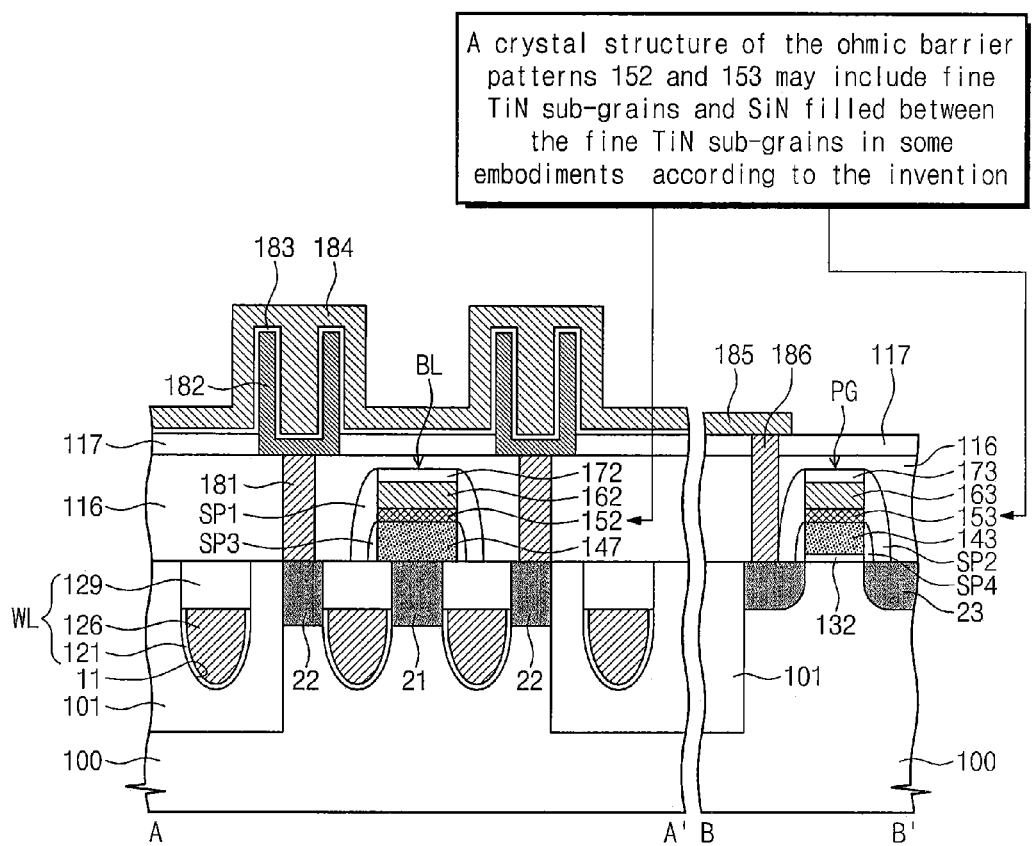
FIG. 13D is a cross-sectional view illustrating methods of forming semiconductor devices according to embodiments of the inventive concept.

Referring to FIGS. 1, 13A, and 13C, an insulating layer 183 and an upper electrode 184 may be sequentially formed on the lower electrodes 182. The lower electrodes 182, the insulating layer 183, and the upper electrode 184 may constitute capacitors of the semiconductor device. The upper electrode 184 may be formed of the same material as the lower electrodes 182. A second contact 186 may be formed to be connected to the third dopant region 23 of the peripheral circuit region PCR. The second contact 186 may electrically connect a peripheral conductive line 185 on the second interlayer insulating layer 117 to the third dopant region 23. The peripheral conductive line 185 may be electrically connected to the bit line BL. However, the inventive concept is not limited thereto.

A semiconductor device according to some embodiments of the inventive concept is described with reference to FIGS. 1, 13A, and 13B.

A substrate 100 including a cell array region CAR and a peripheral circuit region PCR may be provided. For example, the substrate 100 may be a semiconductor substrate formed of silicon, germanium, or silicon-germanium. The cell array region CAR may be a region on which memory cells are disposed. The peripheral circuit region PCR may be a region on which a word line driver, a sense amplifier, a row decoder, and a column decoder are disposed. The substrate 100 may include field isolation layers 101 defining first active regions AR1 in the cell array region CAR and a second active region AR2 in the peripheral circuit region PCR. The first active regions AR1 may be bar-shaped and spaced apart from each other in a plan view. The first active regions AR1 may extend in the third direction (s) non-perpendicular to the first direction (i.e., the x-axis direction) and the second direction (i.e., the y-axis direction).

First and second dopant regions 21 and 22 may be provided in upper portions of the first active regions AR1. The dopant regions 21 and 22 may be doped with dopants of a conductivity type different from that of dopants of the substrate 100. The first dopant region 21 may be provided between a pair of the second dopant regions 22 in each of the first active regions AR1, and the first dopant region 21 and the second dopant regions 22 may be spaced apart from each other by trenches 11.

Cell gate structures may be buried in the substrate 100 of the cell array region CAR. The cell gate structures may be word lines WL. The word lines WL may be provided in the trenches 11, respectively. The word lines WL may extend in the y-axis direction. Each of the word lines WL may include a gate insulating layer 121, a gate electrode 126, and a gate capping pattern 129 which are sequentially stacked in each of the trenches 11.

Conductive lines may be provided on the cell array region CAR. The conductive lines may be connected to the first dopant regions 21 and extend in the x-axis direction. The conductive lines may provide bit lines BL. A peripheral gate structure PG may be provided on the peripheral circuit region PCR. Each of the bit lines BL and the peripheral gate structure PG may include a first conductive pattern, a second conductive pattern, and an ohmic barrier pattern disposed between the first conductive pattern and the second conductive pattern. In some embodiments, each of the bit lines BL may include first conductive patterns 147, an ohmic barrier pattern 152, a second conductive pattern 162, and a capping pattern 172. The first conductive patterns 147 in each of the bit lines BL may be in contact with the first dopant regions 21 arranged in the x-axis direction. The ohmic barrier pattern 152, the second conductive pattern 162, and the capping pattern 172 may be sequentially stacked on the first conductive patterns 147 in each of the bit lines BL.

The peripheral gate structure PG may include a gate insulating layer 132, a first conductive pattern 143, an ohmic barrier pattern 153, a second conductive pattern 163, and a capping pattern 173 which are sequentially stacked on the substrate 100. A first spacer SP1 may be disposed on a sidewall of each of the bit lines BL, and a second spacer SP2 may be disposed on a sidewall of the peripheral circuit region PCR.

The first conductive patterns 147 on the cell array region CAR and the first conductive pattern 143 on the peripheral circuit region PCR may include the same material and may be formed of the same layer. In some embodiments, the first conductive patterns 147 and 143 may include poly-silicon. A conductivity type of dopants of the first conductive patterns 147 on the cell array region CAR may be different from or the same as that of dopants of the first conductive pattern 143 on the peripheral circuit region PCR.

The second conductive pattern 162 on the cell array region CAR and the second conductive pattern 163 on the peripheral circuit region PCR may include the same material and may be formed of the same layer. In some embodiments, the second conductive patterns 162 and 163 may include at least one of tungsten (W), titanium (Ti), and tantalum (Ta). The gate capping patterns 172 and 173 may include at least one of silicon oxide, silicon nitride, and silicon oxynitride.

Each of the bit lines BL may include separation patterns disposed between the first conductive patterns 147. For example, the separation patterns may be first semiconductor patterns 140. The first semiconductor patterns 140 may include undoped poly-silicon. A bottom surface of the ohmic barrier pattern 152 on the cell array region CAR may extend in the x-axis direction and be in contact with the first conductive patterns 147 and the first semiconductor patterns 140 alternatively arranged in the x-axis direction.

The ohmic barrier pattern 152 on the cell array region CAR and the ohmic barrier pattern 153 on the peripheral circuit region PCR may include the same material. In some embodiments, the ohmic barrier patterns 152 and 153 may include a metal-silicon nitride. In some embodiments, the metal-silicon nitride may include at least one of titanium-silicon nitride (TiSiN), tantalum-silicon nitride (TaSiN), and tungsten-silicon nitride (WSiN). A silicon concentration in the ohmic barrier patterns 152 and 153 may be about 10 atm % or more. The silicon concentration of the ohmic barrier pattern 152 (or 153) may be progressively increased from a boundary between the ohmic barrier pattern 152 (or 153) and the second conductive pattern 162 (or 163) to a boundary between the ohmic barrier pattern 152 (or 153) and the first conductive pattern 147 (or 143). For example, the silicon concentration of a portion of the ohmic barrier pattern 152 (or 153) adjacent to the second conductive pattern 162 (or 163) may be within a range of about 10 atm % to about 30 atm %. The silicon concentration of a portion of the ohmic barrier pattern 152 (or 153) adjacent to the first conductive pattern 147 (or 143) may be within a range of about 30 atm % to about 50 atm %. The lower portion of the ohmic barrier pattern 152 (or 153) having the relatively high silicon concentration may provide an ohmic contact between the ohmic barrier pattern 152 (or 153) and the first conductive pattern 147 (or 143). The upper portion of the ohmic barrier pattern 152 (or 153) having the relatively low silicon concentration may prevent dopants of the first conductive pattern 147 (or 143) from being diffused to the second conductive pattern 161 (or 163).

A size of a crystal grain of the ohmic barrier patterns 152 and 153 may be relatively small. For example, an average size of the crystal grains of the ohmic barrier patterns 152 and 153 may be equal to or less than a tenth of an average size of crystal grains of the second conductive patterns 162 and 163. For example, an average diameter of the crystal grains of the ohmic barrier patterns 152 and 153 may be equal to or less than 30 Å. In some embodiments, a crystal structure of the ohmic barrier patterns 152 and 153 may include fine TiN sub-grains and SiN filled between the fine TiN sub-grains as shown in, for example, FIG. 13D in some embodiments according to the invention. The fine structures of the ohmic barrier patterns 152 and 153 may increase a diffusion path of dopants from the first conductive patterns 147 and 143 to the second conductive patterns 162 and 163. Thus, even though the ohmic barrier patterns 152 and 153 may be thin, the ohmic barrier patterns 152 and 153 may sufficiently function as a dopant barrier. As a result, a stack thickness of the semiconductor device may be reduced. In some embodiments, the thickness of the ohmic barrier patterns 152 and 153 may be within a range of about a tenth to about a quarter of a thickness of the first conductive pattern 147. In some embodiments, the second conductive patterns 162 and 163 may be thicker than the ohmic barrier patterns 152 and 153, and the first conductive patterns 147 and 143 may be thicker than the second conductive patterns 162 and 163. A first portion of the bit line BL vertically overlapped with first dopant region 21 may include the first conductive pattern 147, the ohmic barrier pattern 152, and the second conductive pattern 162 which are sequentially stacked. A second portion of the bit line BL vertically overlapped with the field isolation layer 101 may include the separation pattern 140, the ohmic barrier pattern 152, and the second conductive pattern 162 which are sequentially stacked.

Data storage parts may be provided to be electrically connected to the second dopant regions 22, respectively. If the semiconductor device according to some embodiments is a dynamic random access memory (DRAM) device, the data storage parts may be capacitors electrically connected to the second dopant regions 22, respectively. The capacitors may include lower electrodes 182, an upper electrode 184, and an insulating layer 183 disposed between the upper electrode 184 and the lower electrodes 182. The lower electrodes 182 may be electrically connected to the second dopant regions 22 through first contacts 181 penetrating a first interlayer insulating layer 116.

A second contact 186 may penetrate a second interlayer insulating layer 117 and the first interlayer insulating layer 116 to connect to a third dopant region 23 of the peripheral circuit region PCR. The second contact 186 may be connected to a peripheral conductive line 185. The peripheral conductive line 185 may be electrically connected to the bit line BL. However, the inventive concept is not limited thereto.

According to some embodiments of the inventive concept, the conductive line on the cell array region may be formed simultaneously with the peripheral gate structure on the peripheral circuit region. Each of the conductive line and the peripheral gate structure may include the ohmic barrier pattern disposed between the first conductive pattern and the second conductive pattern. The ohmic contact and the dopant diffusion prevention between the first and second conductive patterns may be achieved simultaneously by controlling the silicon concentration of the ohmic barrier pattern. Even though the ohmic barrier pattern is thin, the above effects may be sufficiently achieved by the fine structure of the ohmic barrier pattern. As a result, a stack height of the semiconductor device may be reduced, such that a parasitic capacitance may be reduced to improve an operation speed of the semiconductor device.

FIG. 13C is a cross-sectional view illustrating methods of forming a semiconductor device according to other embodiments of the inventive concept. In the present embodiment, a plurality of spacers may be formed on each of sidewalls of the bit lines BL and the peripheral gate structure PG. A third spacer SP3 and the first spacer SP1 may be sequentially provided on the sidewall of the bit line BL. A fourth spacer SP4 and the second spacer SP2 may be sequentially provided on the sidewall of the peripheral gate structure PG. The third spacer SP3 and the fourth spacer SP4 may be formed by the same process. In some embodiments, a thermal oxidation process may be performed on the sidewalls of the first conductive patterns 147 and 143 formed by the patterning process described with reference to FIGS. 11A and 11B, so that the third and fourth spacers SP3 and SP4 may be formed.

After the third and the four spacers SP3 and SP4 are formed, the first spacer SP1 and the second spacer SP2 may be formed on the third spacer SP3 and the fourth spacer SP4, respectively. In some embodiments, the third and fourth spacers SP3 and SP4 may include silicon oxide, and the first and second spacers SP1 and SP2 may include silicon nitride or silicon oxynitride.

Methods of forming semiconductor devices according to embodiments are described with reference to FIGS. 14A to 17A and 14B to 17B.

FIGS. 14A to 17A are cross-sectional views taken along lines A-A' and B-B' of FIG. 1 illustrating methods of forming semiconductor devices according to embodiments of the inventive concept. FIGS. 14B to 17B are cross-sectional views taken along a line C-C' of FIG. 1 illustrating methods of forming semiconductor devices according to embodiments of the inventive concept.

Figure 14A:
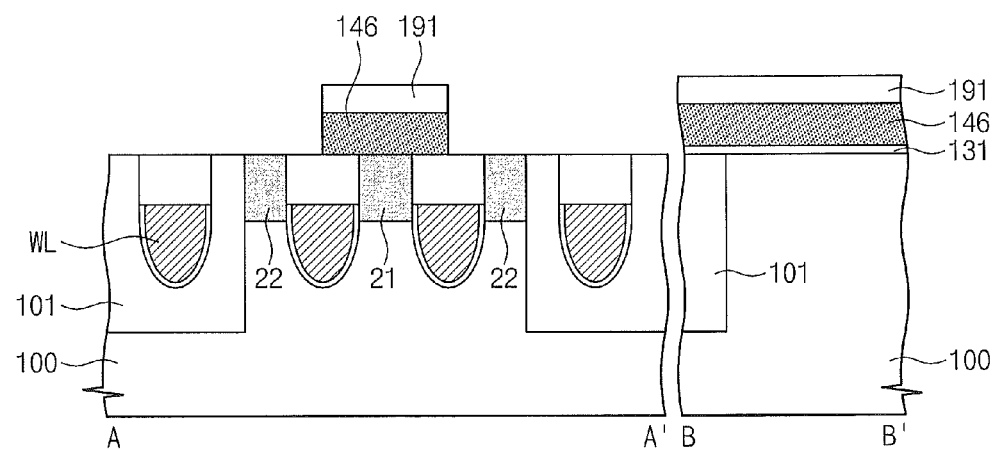
Figure 14B:
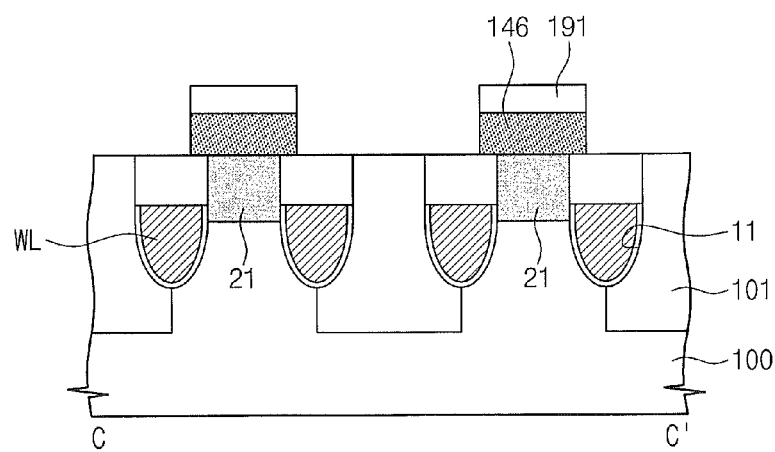

Referring to FIGS. 1, 14A, and 14B, the second insulating layer 131 and the mask pattern 112 on the cell array region CAR may be removed from the structure described with reference to FIGS. 6A and 6B. Subsequently, second semiconductor patterns 146 may be formed on the cell array region CAR and the peripheral circuit region PCR. In some embodiments, the second semiconductor patterns 146 may include doped poly-silicon.

The second semiconductor patterns 146 may cover the first dopant regions 21 and expose the second dopant regions 22. In some embodiments, the second semiconductor patterns 146 on the cell array region CAR may have a circular shape or an elliptic shape in a plan view. The second semiconductor patterns 146 of the cell array region CAR may be spaced apart from each other and be disposed on the first dopant regions 21. A semiconductor layer may be formed on the substrate 100 and then an etching process, using mask patterns 191, may be performed on the semiconductor layer to form the second semiconductor patterns 146.

Figure 15A:
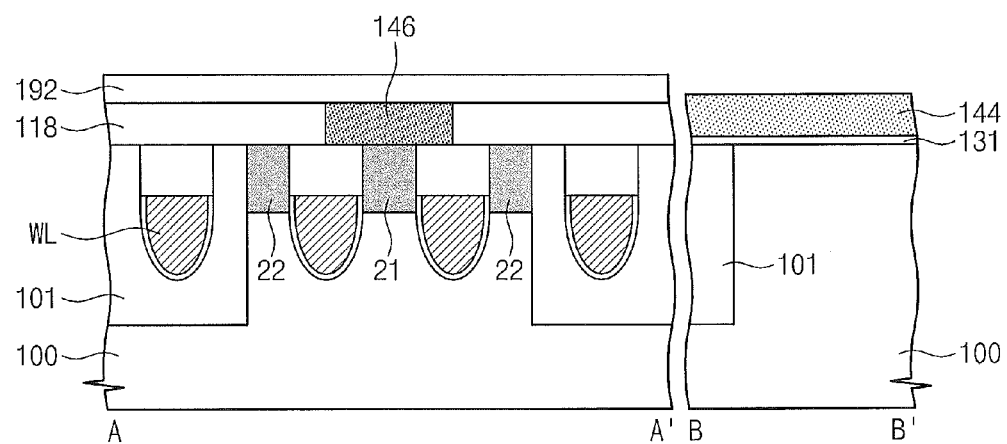
Figure 15B:
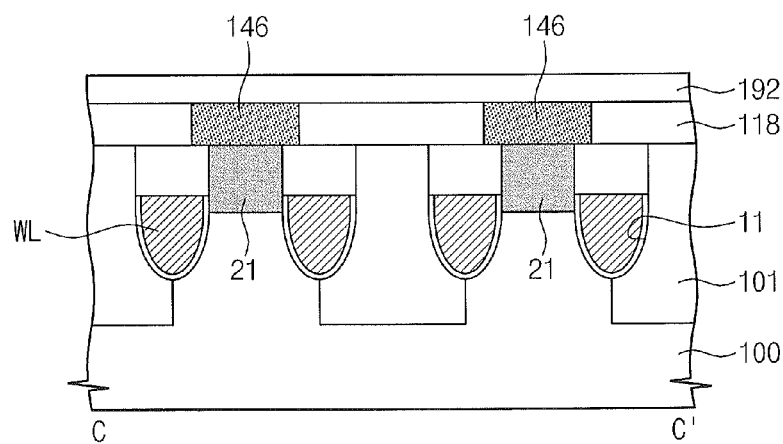

Referring to FIGS. 1, 15A, and 15B, a separation insulating layer 118 may be formed to fill a region between the second semiconductor patterns 146. For example, the separation insulating layer 118 may include at least one of silicon oxide, silicon nitride, and silicon oxynitride. Forming the separation insulating layer 118 may include forming an insulating layer covering the second semiconductor patterns 146 and planarizing the insulating layer until the second semiconductor patterns 146 are exposed.

A mask pattern 192 may be formed to cover the cell array region CAR, and then an ion implantation process may be performed on the second semiconductor pattern 146 of the peripheral circuit region PCR exposed by the mask pattern 192. A conductivity type of the second semiconductor pattern 144 implanted with the dopant ions may be different from the conductivity type of the second semiconductor pattern 146 on the cell array region CAR. For example, if a transistor of the peripheral circuit region PCR is a PMOS transistor and the second semiconductor pattern 146 is an n-type, forming the second semiconductor pattern 144 may include counter doping the semiconductor pattern 146 on the peripheral circuit region PCR with p-type dopants. Alternatively, if the transistor of the peripheral circuit region PCR is an NMOS transistor and the second semiconductor pattern 146 is n-type, the present ion implantation process may be omitted.

Figure 16A:
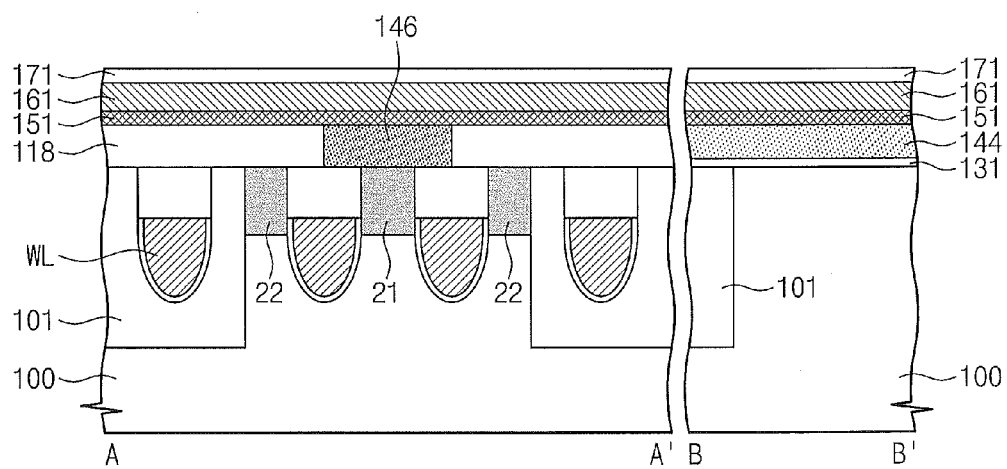
Figure 16B:
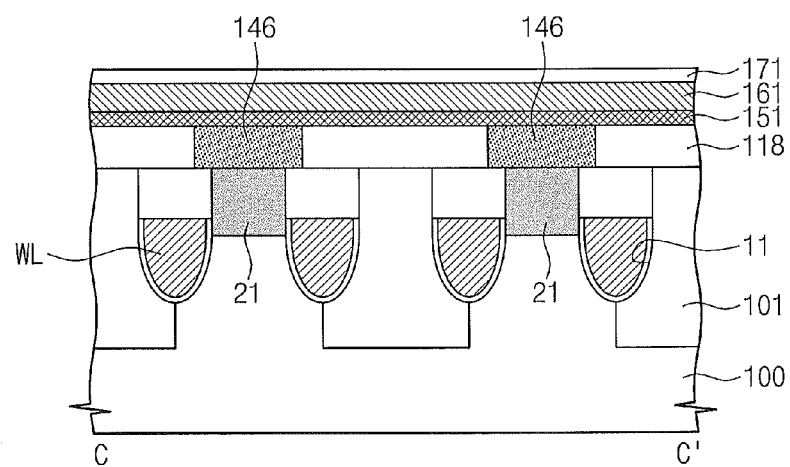

Referring to FIGS. 1, 16A, and 16B, the mask pattern 192 may be removed, and then an ohmic barrier layer 151, a metal layer 161, and a capping layer 171 may be sequentially formed on the cell array region CAR and the peripheral circuit region PCR. The ohmic barrier layer 151 may include a metal-silicon nitride. In some embodiments, the metal-silicon nitride may include at least one of titanium-silicon nitride (TiSiN), tantalum-silicon nitride (TaSiN), and tungsten-silicon nitride (WSiN). In some embodiments, the ohmic barrier layer 151 may be formed by a CVD or ALD process using a source gas including $TiCl_4$, di-chlorosilane (DCS), and $NH_3$. In some embodiments, the ohmic barrier layer 151 may be formed at a temperature within a range of about 560° C. to about 680° C. The metal layer 161 may include at least one of tungsten (W), titanium (Ti), and tantalum (Ta). The capping layer 171 may include at least one of silicon oxide, silicon nitride, and silicon oxynitride. Each of the metal layer 161 and the capping layer 171 may be formed using a sputtering process or a CVD process.

Figure 17A:
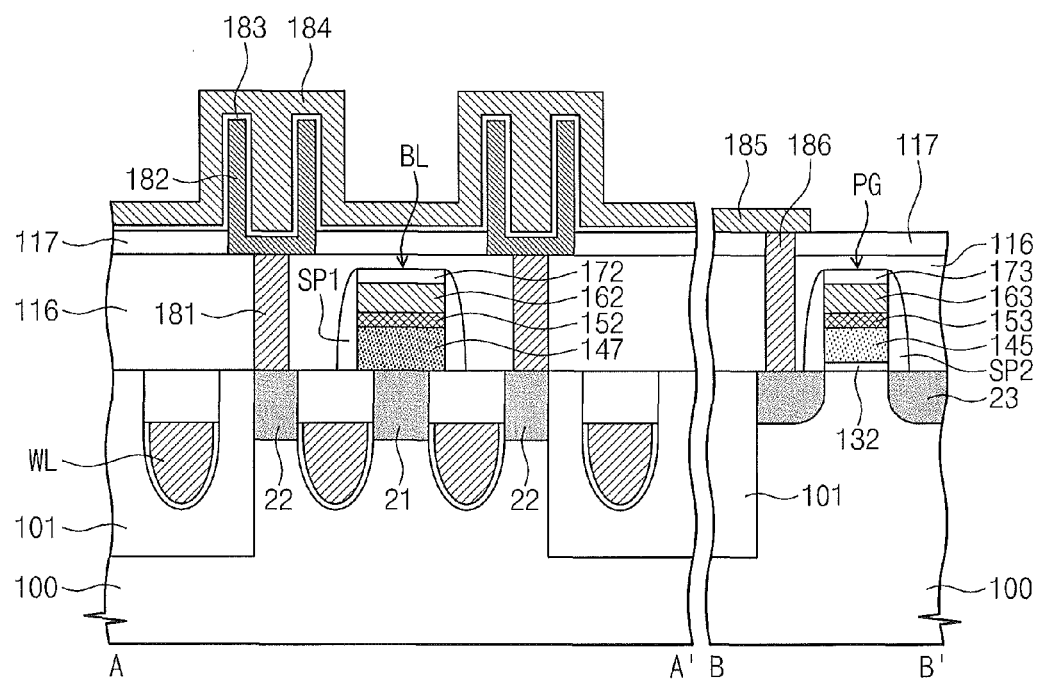
Figure 17B:
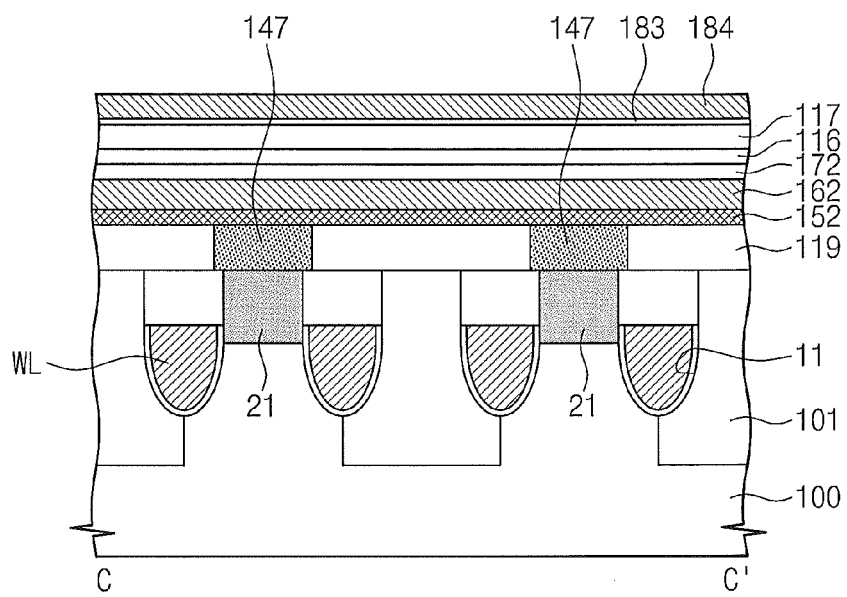

Referring to FIGS. 1, 17A, and 17B, the capping layer 171, the metal layer 161, the ohmic barrier layer 151, and the second semiconductor patterns 146 and 144 may be patterned to form conductive lines on the cell array region CAR and a peripheral gate structure PG on the peripheral circuit region PCR. The conductive lines may be bit lines BL of the semiconductor device. Each of the bit lines BL may include a plurality of first conductive patterns 147, an ohmic barrier pattern 152, a second conductive pattern 162, and a capping pattern 172.

The first conductive patterns 147 may be connected to the first dopant regions 21 arranged in one direction. The ohmic barrier pattern 152, the second conductive pattern 162, and the capping pattern 172 may be sequentially formed on the plurality of first conductive patterns 147 in each of the bit lines BL. The separation insulating layer 118 may be divided into separation insulating patterns 119 by the patterning process. The separation insulating patterns 119 under each of the ohmic barrier patterns 152 may be disposed between the first conductive patterns 147 of each of the bit lines BL.

The peripheral gate structure PG may include a gate insulating layer 132, a first conductive pattern 145, an ohmic barrier pattern 153, a second conductive pattern 163, and a capping pattern 173 which are sequentially stacked on the substrate 100. A first spacer SP1 and a second spacer SP1 may be formed on sidewalls of the bit lines BL and on sidewalls of the peripheral gate structures PG, respectively. Third dopant regions 23 may be formed in the second active region AR2 at both sides of the peripheral gate structure PG, respectively.

A first interlayer insulating layer 116 may be formed to cover the bit lines BL and the peripheral gate structure PG, and then first contacts 181 may be formed to penetrate the first interlayer insulating layer 116. The first contacts 181 may be connected to the second dopant regions 22, respectively. A second interlayer insulating layer 117 may be formed to cover the first contacts 181, and then lower electrodes 182 may be formed to penetrate the second interlayer insulating layer 117. The lower electrodes 182 may be connected to the first contacts 181, respectively. In some embodiments, each of the lower electrodes 182 may have a hollow cylinder-shape of which a bottom end is closed.

An insulating layer 183 and an upper electrode 184 may be sequentially formed on the lower electrodes 182. The lower electrodes 182 and the insulating layer 183, and the upper electrodes 184 may provide capacitors of the semiconductor device. The upper electrode 184 may be formed of the same material. A second contact 186 may be formed to be connected to the third dopant region 23 of the peripheral circuit region PCR. The second contact 186 may connect a peripheral conductive line 185 on the second interlayer insulating layer 117 to the third dopant region 23. The peripheral conductive line 185 may be electrically connected to the bit line BL. However, the inventive concept is not limited thereto.

A semiconductor device according to embodiments is described with reference to FIGS. 1, 17A, and 17B again. Each of the bit lines BL may include separation patterns respectively disposed between the first conductive patterns 147. In some embodiments, the separation patterns may be the separation insulating patterns 119. In some embodiments, the separation insulating patterns 119 may include at least one of silicon oxide, silicon nitride, and silicon oxynitride. A bottom surface of the ohmic barrier pattern 152 of the cell array region CAR may extend in the x-axis direction and be in contact with the first conductive patterns 147 and the separation insulating patterns 119 which are alternately arranged in the x-axis direction.

Figure 18:
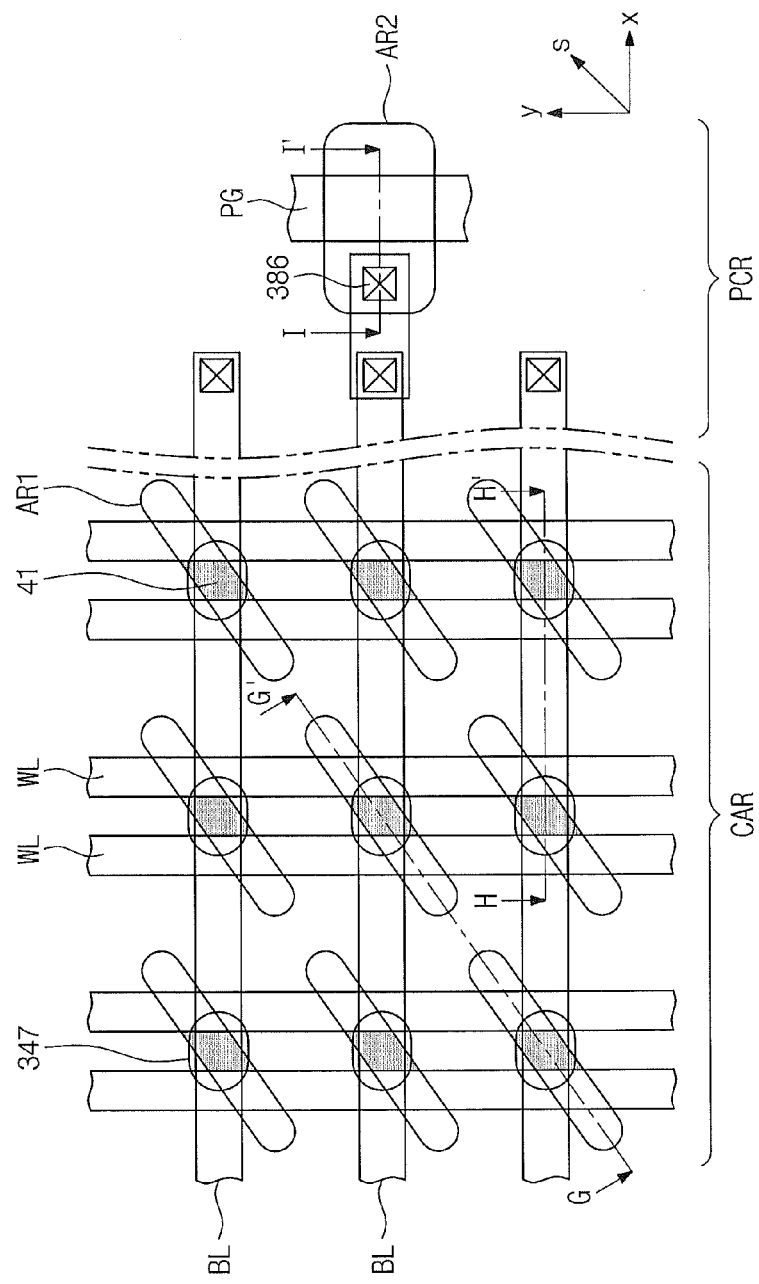
FIG. 18 a plan view illustrating semiconductor devices according to embodiments of the inventive concept.

FIG. 18 a plan view illustrating semiconductor devices according to embodiments of the inventive concept. FIGS. 19A to 24A are cross-sectional views taken along a line G-G' of FIG. 18 illustrating methods of forming semiconductor devices according to embodiments of the inventive concept. FIGS. 19B to 24B are cross-sectional views taken along lines H-H' and I-I' of FIG. 18 illustrating methods of forming semiconductor devices according to embodiments of the inventive concept.

Figure 19A:
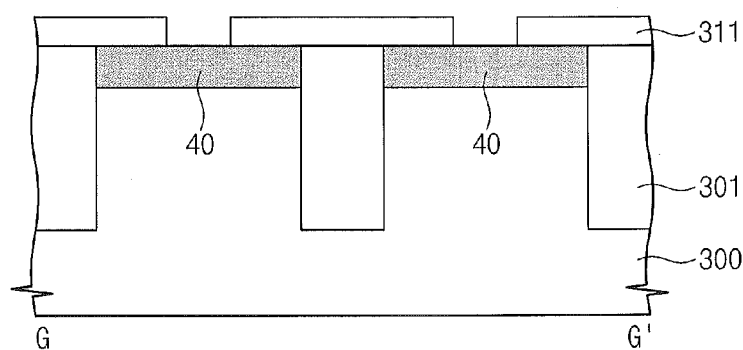
Figure 19B:
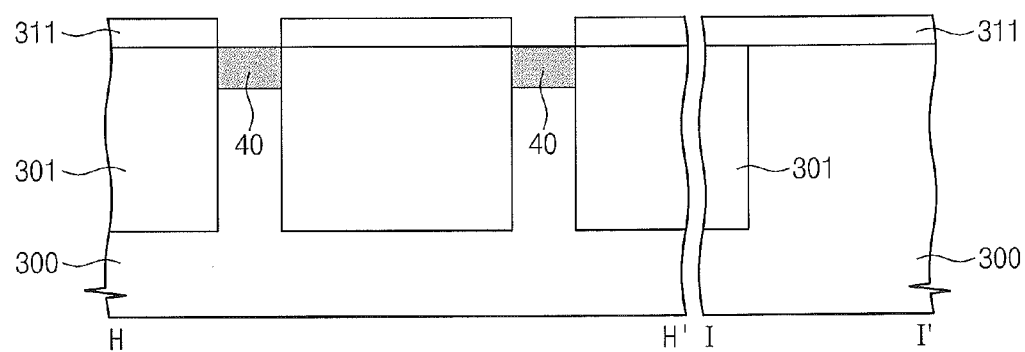

Referring to FIGS. 18, 19A, and 19B, field isolation layers 301 may be formed in a substrate 300 to define first active regions AR1 in a cell array region CAR and a second active region AR2 in a peripheral circuit region PCR. The substrate 300 may be a semiconductor substrate formed of for example, silicon, germanium, or a silicon-germanium. A dopant region 40 may be formed in an upper portion of each of the first active regions AR1. Dopant ions of a conductivity type different from that of the substrate 300 may be implanted into an upper portion of the substrate 100 to form the dopant regions 40.

A mask pattern 311 including openings may be formed on the cell array region CAR. Each of the openings of the mask pattern 311 may extend in a y-axis direction and expose the dopant regions 40 arranged in the y-axis direction. The mask pattern 311 may cover the peripheral circuit region PCR.

Figure 20A:
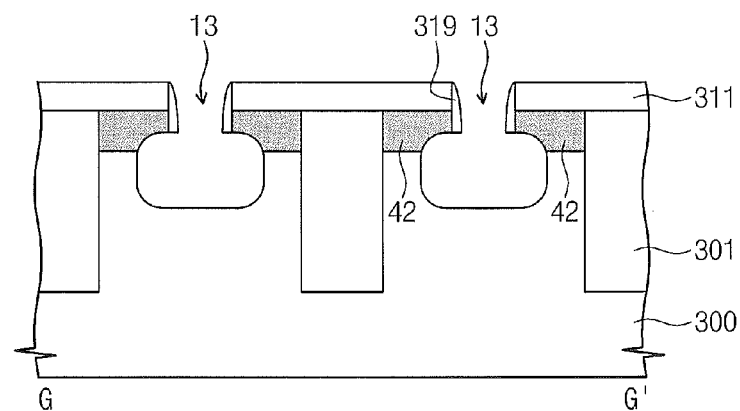
Figure 20B:
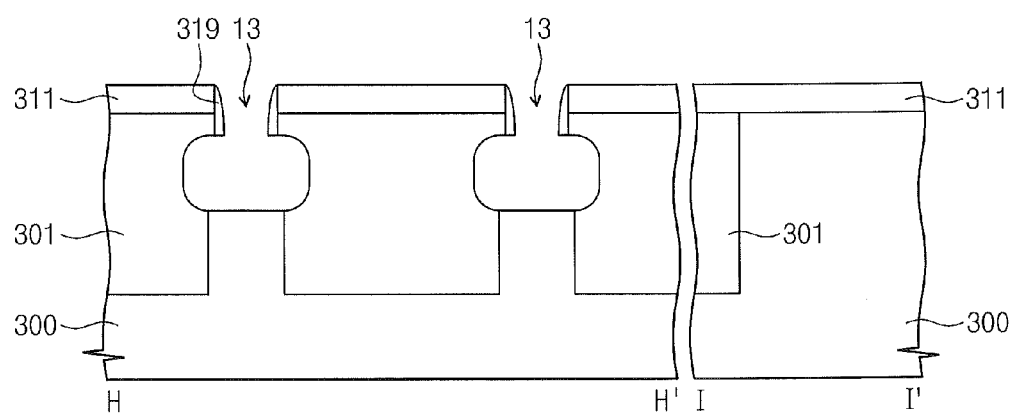

Referring to FIGS. 18, 20A, and 20B, trenches 13 may be formed in the substrate 100 using the mask pattern 311 as an etch mask. The trenches 13 may extend along the y-axis direction and be spaced apart from each other in an x-axis direction. An upper width of the trench 13 may be smaller than a lower width of the trench 13. The trenches 13 may be formed by a plurality of etching processes. In some embodiments, an upper portion of the substrate 300 may be etched by an anisotropic etching process to form first etching regions. Protecting spacers 319 may be formed on sidewalls of the first etching regions.

The substrate 300 exposed by the protecting spacers 319 may be etched by an isotropic etching process to second etching regions. The second etching region may extend from the first etching region, and a width of the second etching region may be greater than that of the first etching region. When the second etching regions are formed, portions of the field isolation layers 301 may also be etched. Each of the dopant regions 40 may be divided into second dopant regions 42 spaced apart from each other by the formation of the trenches 13.

Figure 21A:
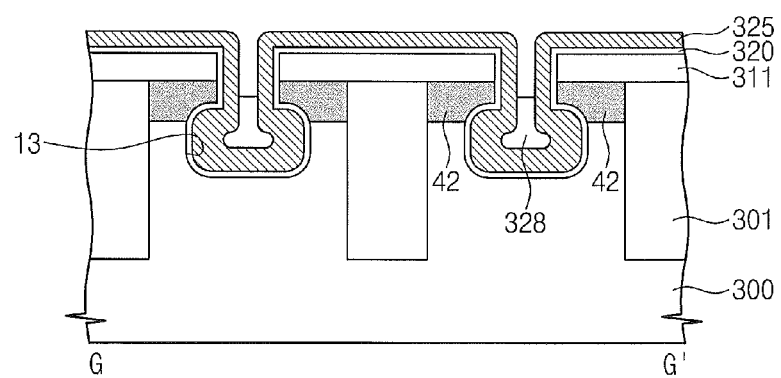
Figure 21B:
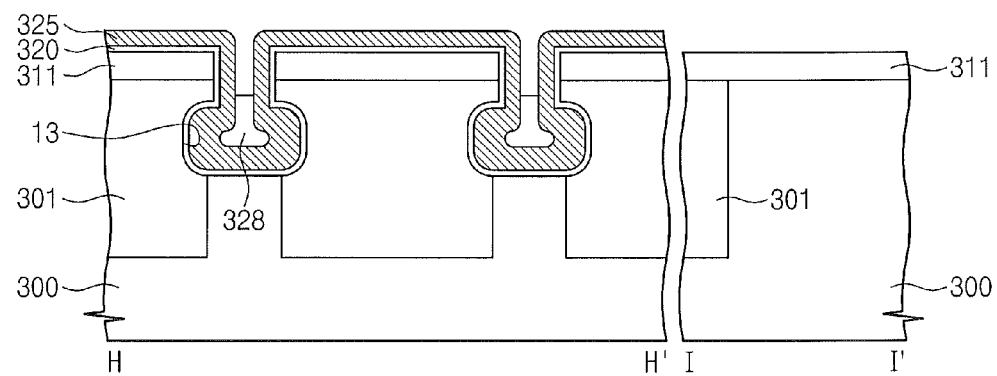

Referring to FIGS. 18, 21A, and 21B, a first insulating layer 320, a conductive layer 325, and a filling layer 328 may be sequentially formed in the trenches 13. The filling layer 328 may fill the trenches 13 in which the first insulating layer 320 and the conductive layer 325 are formed, and then the filling layer 328 may be recessed to have a top surface lower than a top surface of the substrate 300. In some embodiments, the first insulating layer 320 may include at least one of a silicon oxide layer, a silicon nitride layer, and a silicon oxynitride layer. The conductive layer 325 may include at least one of a doped semiconductor material, a conductive metal nitride, a metal, and a metal-semiconductor compound. The filling layer 328 may include at least one of a silicon oxide layer, a silicon nitride layer, and a silicon oxynitride layer. Each of the first insulating layer 320, the conductive layer 325, and the filling layer 328 may be formed by at least one of a CVD process, a PVD process, and an ALD process.

Figure 22A:
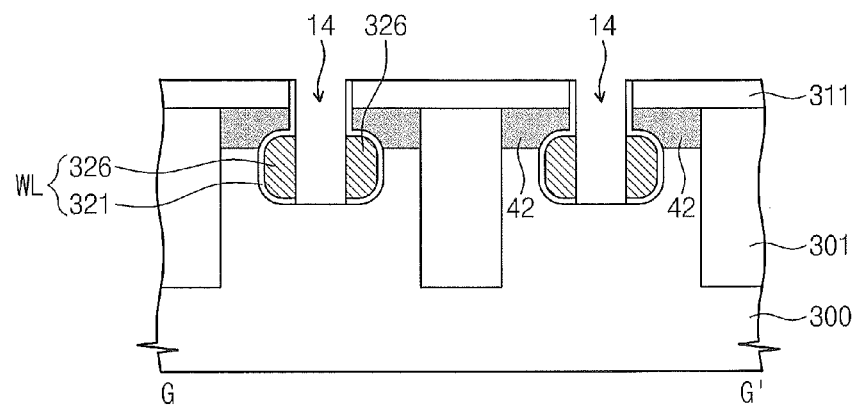
Figure 22B:
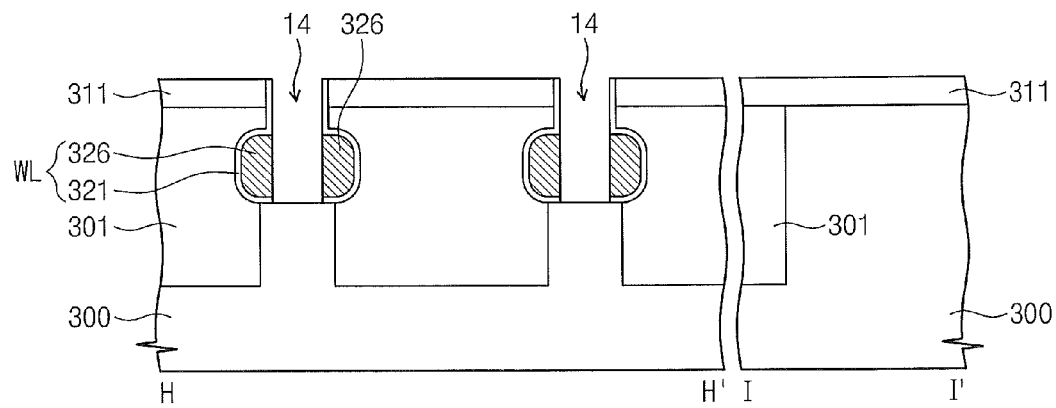

Referring to FIGS. 18, 22A, and 22B, a portion of the conductive layer 325 higher than the top surface of the filling layer 328 may be removed. At this time, a portion of the conductive layer 325 lower than the top surface of the filling layer 328 may remain. The portion of the conductive layer 325 may be removed by an isotropic etching process.

After the filling layer 328 is removed, the remaining conductive layer 325 may be anisotropically etched using the mask pattern 311 as an etch mask to form cell gate structures separated from each other by trenches 14. In some embodiments, the cell gate structures may be word lines WL. The word lines WL adjacent to both sides of each of the trenches 14 may be mirror-symmetrical to each other with respect to each of the trenches 14.

Figure 23A:
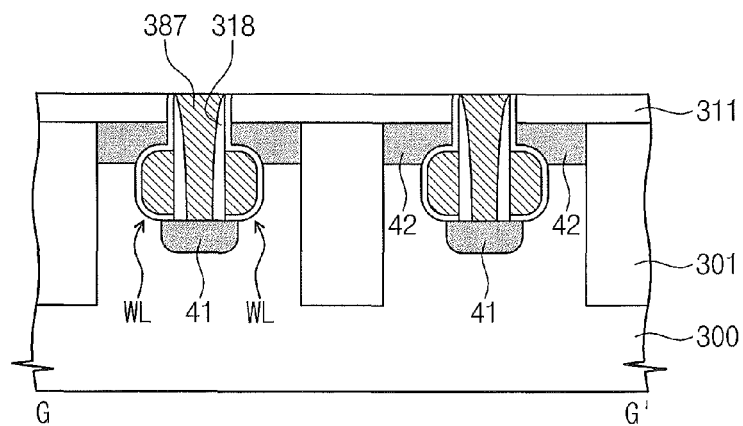
Figure 23B:
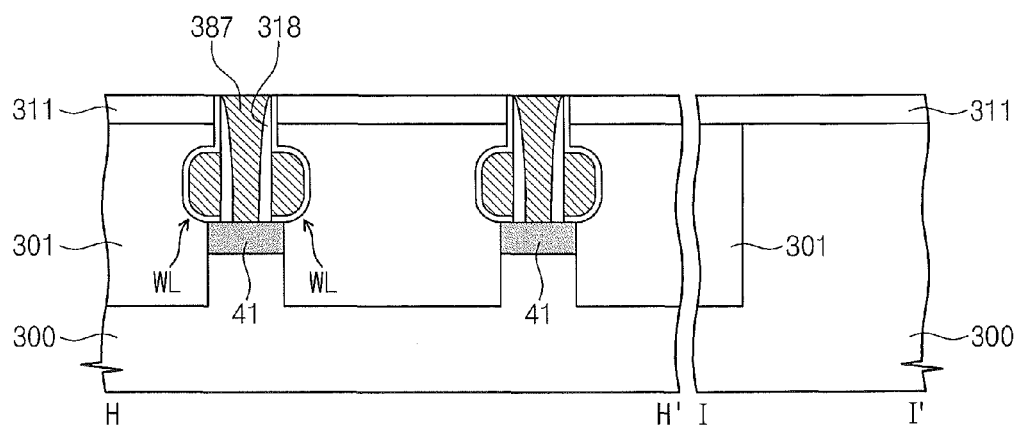

Referring to FIGS. 18, 23A, and 23B, trenches spacers 318 may be formed on sidewalls of the trenches 14 to expose the substrate 300, and then first dopant regions 41 may be formed in the substrate 300 exposed by the trenches 14. The first dopant regions 41 may be spaced apart from each other by the word lines WL and the field isolation layers 301, to be two-dimensionally arranged in a plan view. Contact patterns 387 may be formed to respectively fill the trenches 14 of the result structure including the first dopant regions 41. The contact patterns 387 are connected to the first dopant regions 41. The contact patterns 387 may extend along the word lines WL in the y-axis direction. Forming the contact patterns 387 may be provided by forming a conductive layer filling the trenches 14, and performing a planarization process on the conductive layer until the mask pattern 311 is exposed. The trench spacers 318 may be formed of at least one of silicon oxide, silicon nitride, and silicon oxynitride. The contact patterns 387 may be formed of at least one of a metal, a conductive metal nitride, and a doped semiconductor material.

Figure 24A:
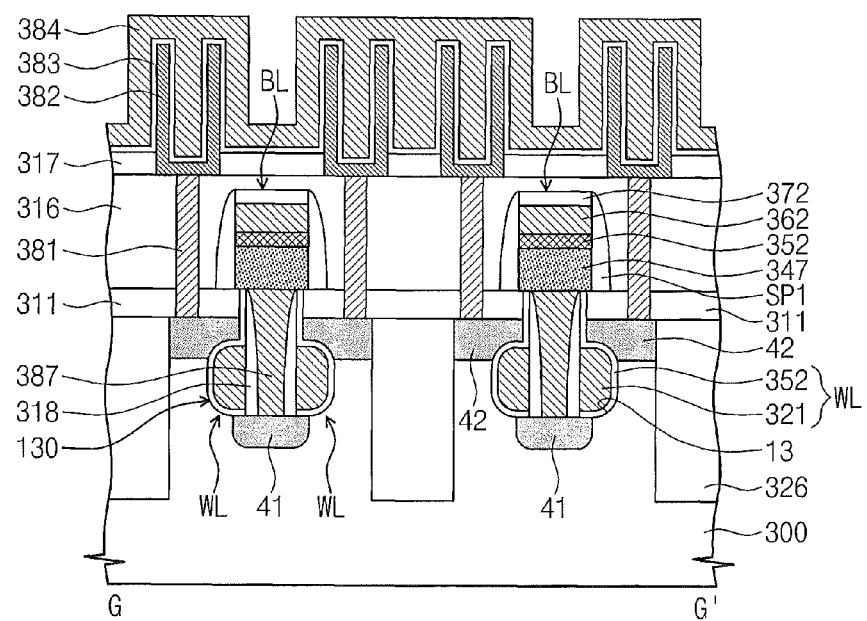
Figure 24B:
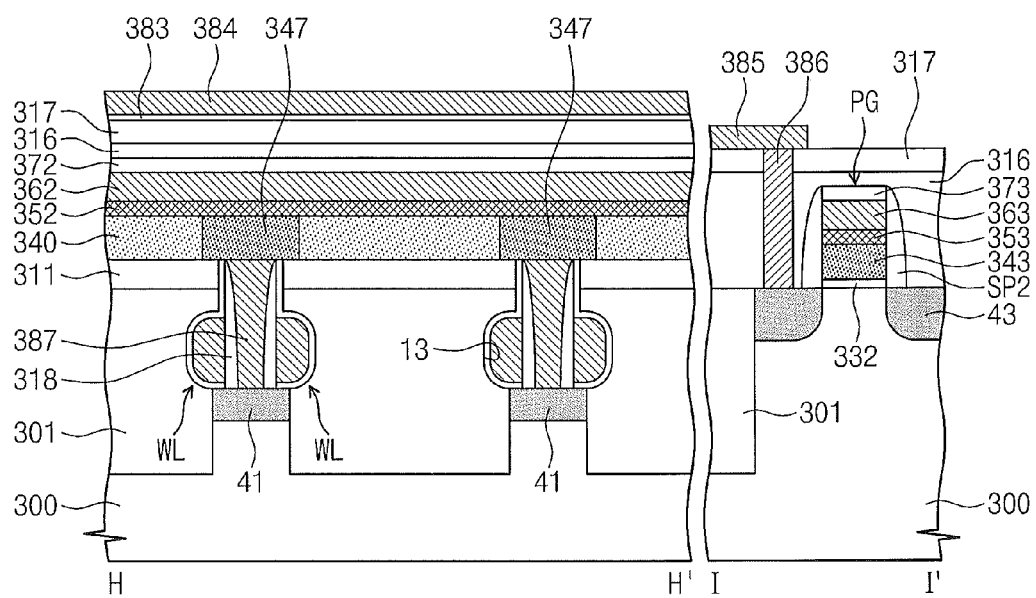

Referring to FIGS. 18, 24A, and 24B, bit lines BL may be formed on the cell array region CAR, and a peripheral gate structure PG may be formed on the peripheral circuit region PCR. The bit lines BL and the peripheral gate structure PG may be formed by the processes described with reference to FIGS. 6A to 11A and 6B to 11B. Capacitors may be formed to be electrically connected to the second dopant regions 42 through first contacts 381, respectively. The capacitors may include lower electrodes 382, an upper electrode 384, and an insulating layer 383 disposed between the upper electrode 384 and the lower electrodes 382. A peripheral conductive line 385 may be formed to be electrically connected to a third dopant region 43 of the peripheral circuit region PCR through a second contact 386. The capacitors, the contacts 381 and 386, and the peripheral conductive line 385 may be formed by the processes described with reference to FIGS. 12A, 12B, 13A, and 13B.

A semiconductor device according to embodiments is described with reference to FIGS. 18, 24A, and 24B. A substrate 300 including a cell array region CAR and a peripheral circuit region PCR may be provided. The substrate 300 may be a semiconductor substrate formed of, for example, silicon, germanium, or a silicon-germanium.

Cell gate structures may be provided to be buried in the substrate 300 of the cell array region CAR. The cell gate structures may be word lines WL including gate insulating layers 321 and gate electrodes 326. In some embodiments, each of the word line WL may have a cross section of a semicircular shape. The word lines WL may be provided in the trenches 13 and extend in the y-axis direction. A pair of the word lines WL in each of the trenches 13 may be mirror-symmetrical to each other with respect to the contact pattern 387 disposed therebetween. The contact patterns 387 may extend along the word lines WL in the y-axis direction and be connected to first dopant regions 41 formed under the trenches 13.

Second dopant regions 42 may be formed in upper portions of the first active regions AR1. The second dopant regions 42 may be vertically spaced apart from the first dopant regions 41. The dopant regions 41 and 42 may be doped with dopants of a conductivity type different from that of the substrate 300.

Conductive lines may be disposed on the cell array region CAR. The conductive lines may be electrically connected to the first dopant regions 41 and extend in the x-axis direction. The conductive lines may be bit lines BL. A peripheral gate structure PG may be provided on the peripheral circuit region PCR. Each of the bit lines BL and the peripheral gate structure PG may include a first conductive pattern, a second conductive pattern, and an ohmic barrier pattern disposed between the first conductive pattern and the second conductive pattern. In some embodiments, each of the bit lines BL may include first conductive patterns 347, and an ohmic barrier pattern 352, a second conductive pattern 362, and the capping pattern 372 sequentially stacked on the first conductive patterns 347. The peripheral gate structure PG may include a gate insulating layer 332, a first conductive pattern 343, an ohmic barrier pattern 353, a second conductive pattern 363, and a capping pattern 373 which are sequentially stacked on the substrate 300. A first spacer SP1 and a second spacer SP2 may be disposed on sidewalls of each of the bit lines BL and a sidewall of the peripheral gate structure PG, respectively.

Each of the bit lines BL may further include separation patterns disposed between the first conductive patterns 347. In some embodiments, the separation patterns may be first semiconductor patterns 340. The first semiconductor patterns 340 may include undoped poly-silicon. A bottom surface of the ohmic barrier pattern 352 on the cell array region CAR may extend in the x-axis direction and be in contact with the first conductive patterns 347 and the first semiconductor patterns 340 alternately arranged in the x-axis direction.

Data storage parts may be provided to be electrically connected to the second dopant regions 42, respectively. If the semiconductor device according to some embodiments is a DRAM device, the data storage parts may be capacitors electrically connected to the second dopant regions 42, respectively. The capacitors may include lower electrodes 382, an upper electrode 384, and an insulating layer 383 disposed between the upper electrode 384 and the lower electrodes 382. The lower electrodes 382 may be electrically connected to the second dopant regions 42 through first contacts 381 penetrating a first interlayer insulating layer 316, respectively.

A second contact 386 may penetrate a second interlayer insulating layer 317 and the first interlayer insulating layer 316 to be connected to a third dopant region 43 of the peripheral circuit region PCR. The second contact 386 may be connected to a peripheral conductive line 385. The peripheral conductive line 385 may be electrically connected to the bit line BL. However, the inventive concept is not limited thereto.

Figure 25:
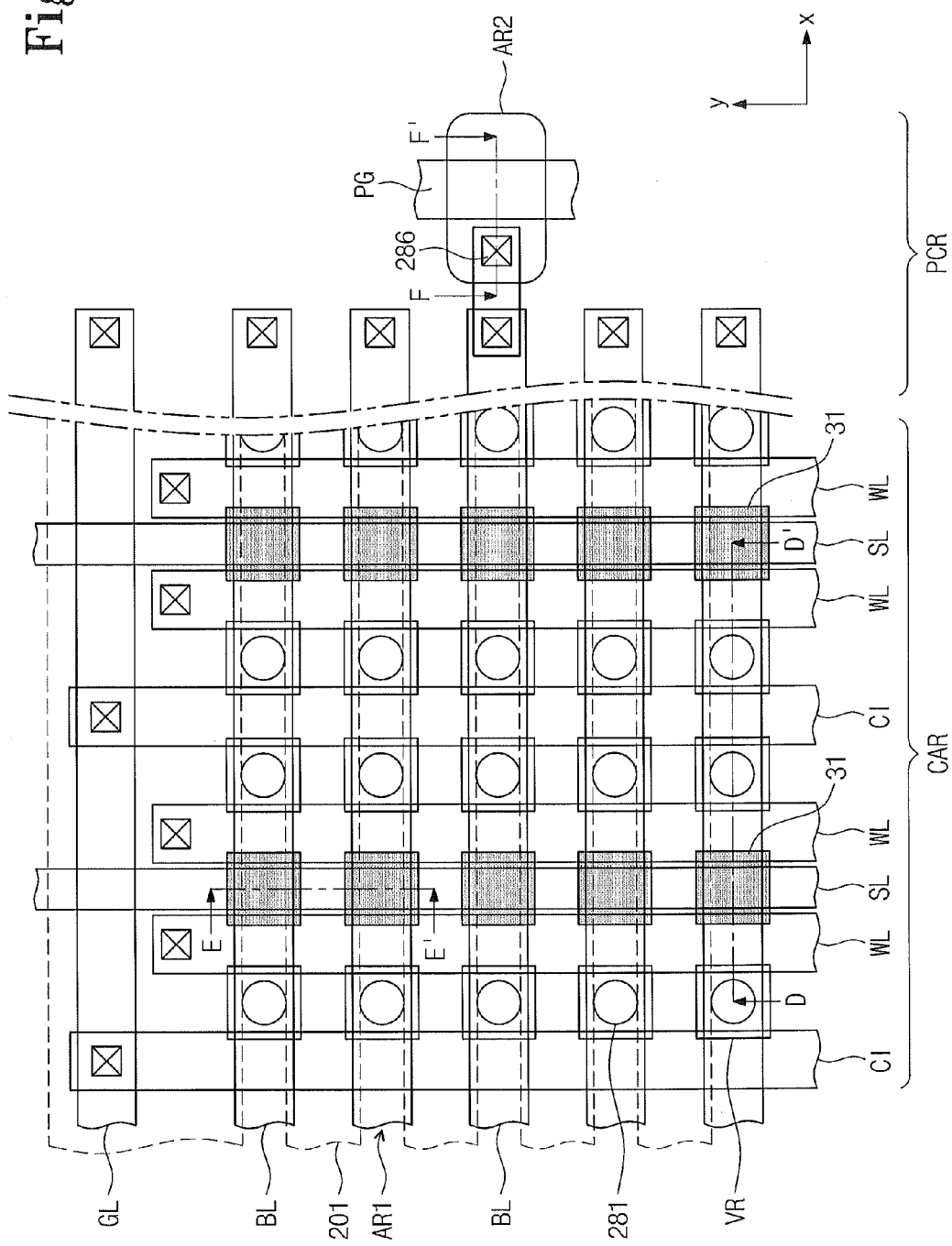
FIG. 25 is a plan view illustrating semiconductor devices according to embodiments of the inventive concept.

FIG. 25 is a plan view illustrating semiconductor devices according to embodiments of the inventive concept. FIGS. 26A to 36A are cross-sectional views taken along a line D-D' of FIG. 25 illustrating methods of forming semiconductor devices according to embodiments of the inventive concept. FIGS. 26B to 36B are cross-sectional views taken along lines E-E' and F-F' of FIG. 25 illustrating methods of forming semiconductor devices according to embodiments of the inventive concept.

Figure 26A:
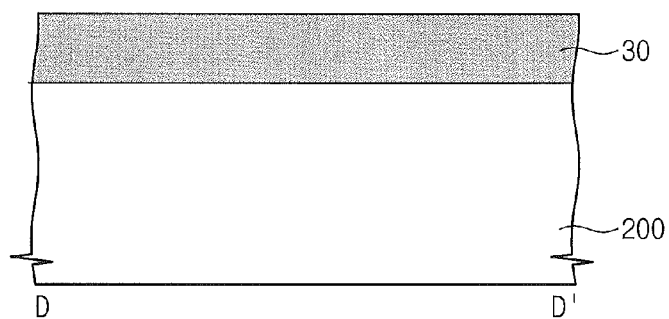
Figure 26B:
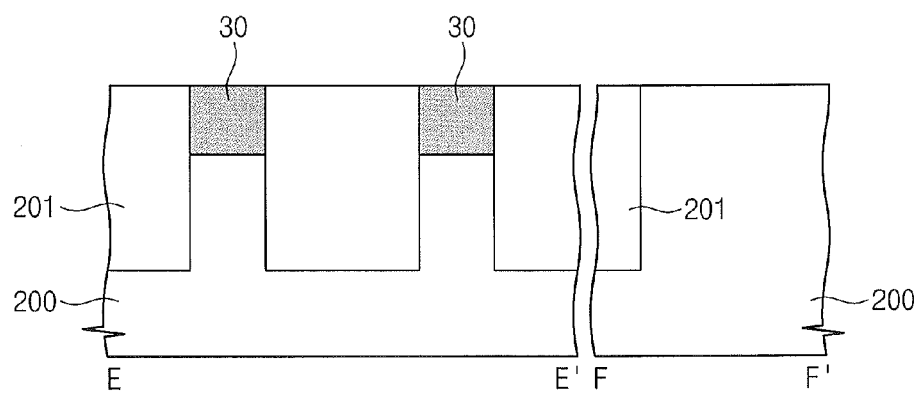

Referring to FIGS. 25, 26A, and 26B, field isolation regions 201 may be formed in a substrate 200 to define first active regions AR1 in a cell array region CAR and a second active region AR2 in a peripheral circuit region PCR. The first active regions AR1 and the field isolation regions 201 of the cell array region CAR may be line-shaped extending in an x-axis direction in a plan view. A dopant region 30 may be formed in an upper portion of each of the first active region AR1. The dopant region 30 may be doped with dopants of a conductivity type different from a conductivity type of the substrate 200.

Figure 27A:
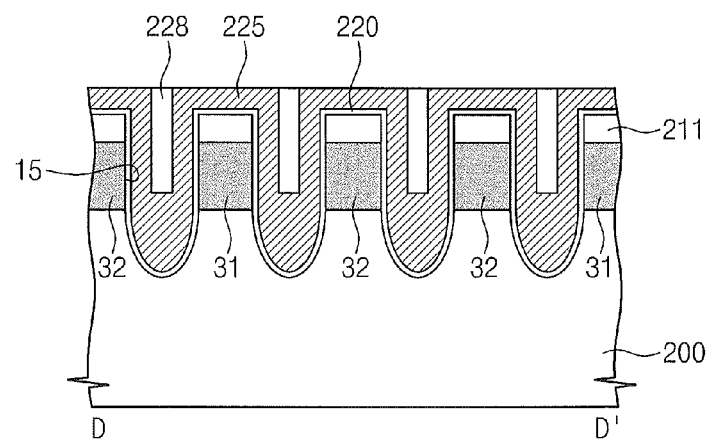
Figure 27B:
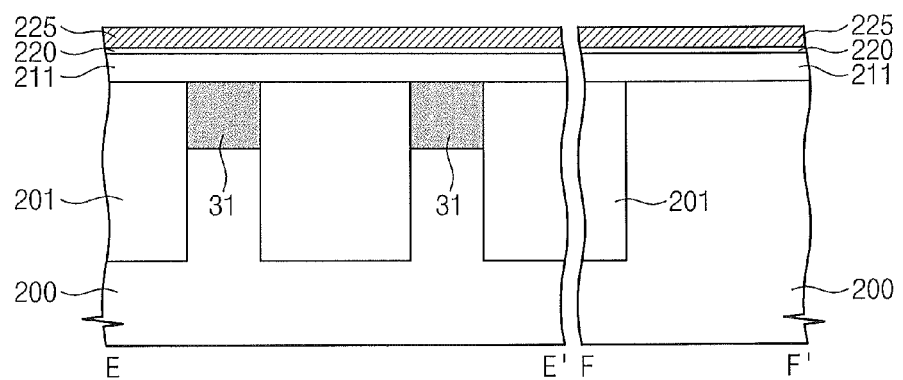

Referring to FIGS. 25, 27A, and 27B, trenches 15 extending in a y-axis direction may be formed in the cell array region CAR. The trenches 15 may be formed by etching the substrate 200 using a mask pattern 211. A first insulating layer 220, a conductive layer 225, and a filling layer 228 may be sequentially formed in the trenches 15. After the first insulating layer 220 and the conductive layer 225 are formed in the trenches 15, the filling layer 228 may be formed to fill the trenches 15. In some embodiments, the first insulating layer 220 may include at least one of a silicon oxide layer, a silicon nitride layer, and a silicon oxynitride layer. The conductive layer 225 may include at least one of a doped semiconductor material, a conductive metal nitride, and a metal-semiconductor compound. The filling layer 228 may include at least one of a silicon oxide layer, a silicon nitride layer, and a silicon oxynitride layer. Each of the first insulating layer 220, the conductive layer 225, and the filling layer 228 may be formed by at least one of a CVD process, a PVD process, and an ALD process.

Figure 28A:
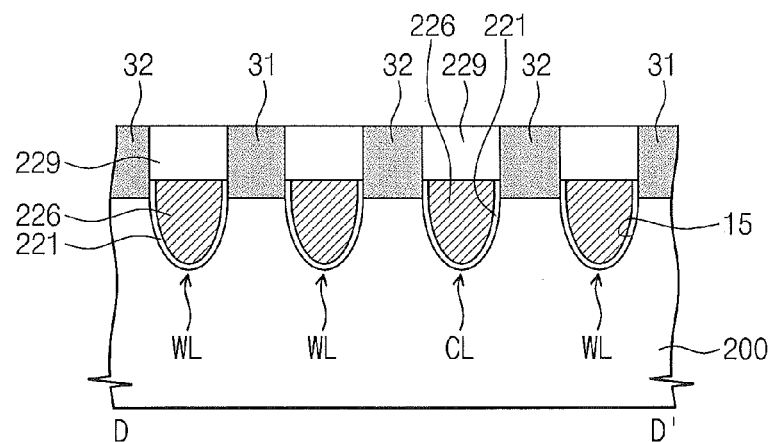
Figure 28B:
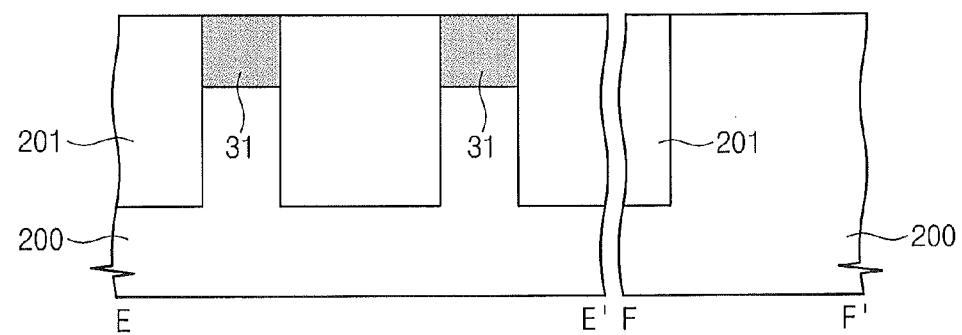

Referring to FIGS. 25, 28A, and 28B, the conductive layer 225 and the first insulating layer 220 may be successively etched. Due to the etching process, the first insulating layer 220 may be divided into gate insulating layers 221 separated from each other, and the conductive layer 225 may be divided into gate electrodes 226 separated from each other. The gate insulating layers 221 and the gate electrodes 226 may be confined within the trenches 15. The etching process of the conductive layer 225 and the first insulating layer 220 may be performed until the filling layer 228 is removed, such that top ends of the gate insulating layers 221 and top surfaces of the gate electrodes 226 are recessed within the trenches to be lower than a top surface of the substrate 200. Gate capping patterns 229 may be formed on the gate electrodes 226, respectively. Thus, gate structures may be formed in the trenches 15, respectively.

The gate structures in the trenches 15 may include word lines WL and separation gate structures CL. The word lines WL may have substantially the same structure as the separation gate structures CL. In a plan view, a pair of word lines WL may be formed between the separation gate structures CL adjacent to each other. The dopant regions 30 may be divided by the word lines WL and the separation gate structures CL, so that first dopant regions 31 may be formed between the word lines WL and second dopant regions 32 may be formed between each of the word lines WL and each of the separation gate structures CL. The first dopant regions 31 may be arranged in the y-axis direction and be spaced apart from each other between the word lines WL. The second dopant regions 32 may be arranged in the y-axis direction and be spaced apart from each other between the word line WL and the separation gate structure CL.

Figure 29A:
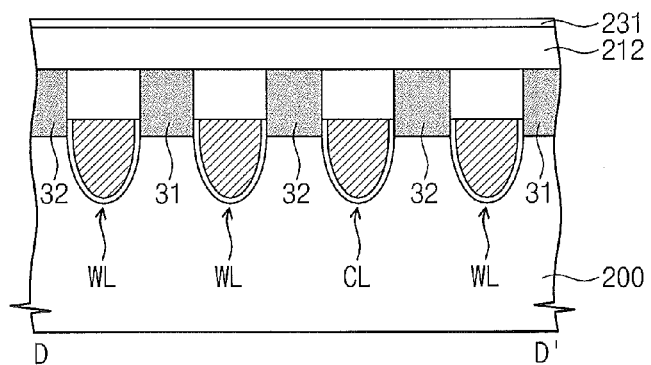
Figure 29B:
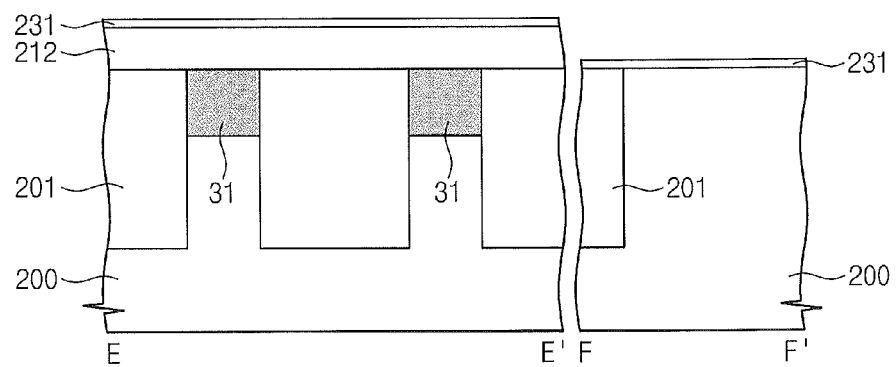

Referring to FIGS. 25, 29A, and 29B, a mask pattern 212 may be formed to cover the cell array region CAR. The mask pattern 212 may not cover the peripheral circuit region PCR. A second insulating layer 231 may be formed on the peripheral circuit region PCR and on the mask pattern 212 in the CAR. The second insulating layer 231 may include at least one of silicon oxide, silicon oxynitride, and high-k dielectric layer having a dielectric constant greater than silicon oxide. In some embodiments, the mask pattern 212 may include at least one of a photoresist, a silicon nitride layer, and a silicon oxide layer.

Figure 30A:
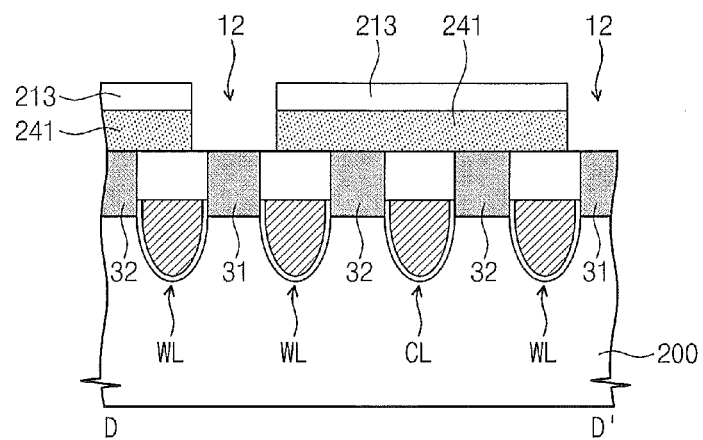
Figure 30B:
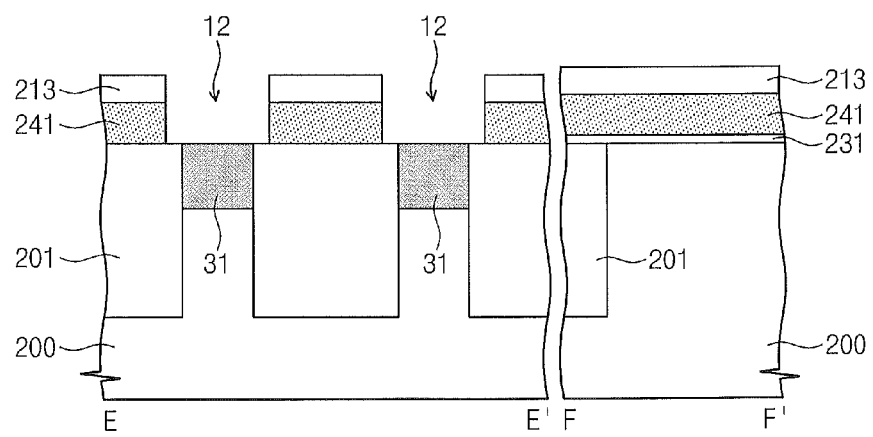

Referring to FIGS. 25, 30A, and 30B, the second insulating layer 231 and the mask pattern 212 of the cell array region CAR may be removed, and then a first semiconductor layer 241 may be formed on the cell array region CAR and the peripheral circuit region PCR. For example, the first semiconductor layer 241 may be an undoped silicon layer. Through-holes 12 may be formed to penetrate the first semiconductor layer 241. The through-holes 12 may expose the first dopant regions 31, respectively. Each of the through-holes 12 may have a circular shape or an elliptic shape in a plan view. A mask pattern 213 may be formed on the first semiconductor layer 241 and then a dry and/or wet etching process may be performed on the first semiconductor layer 241 to form the through-holes 12.

Figure 31A:
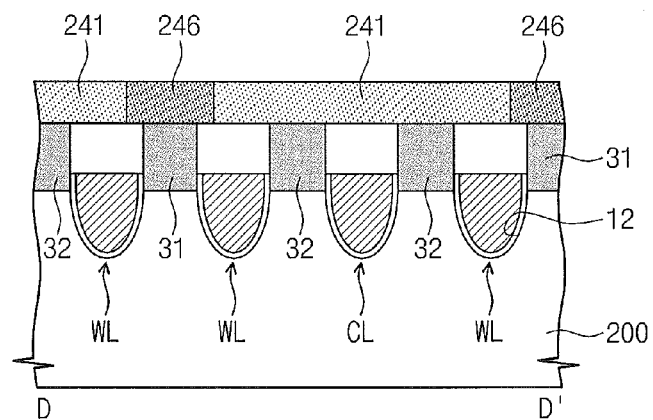
Figure 31B:
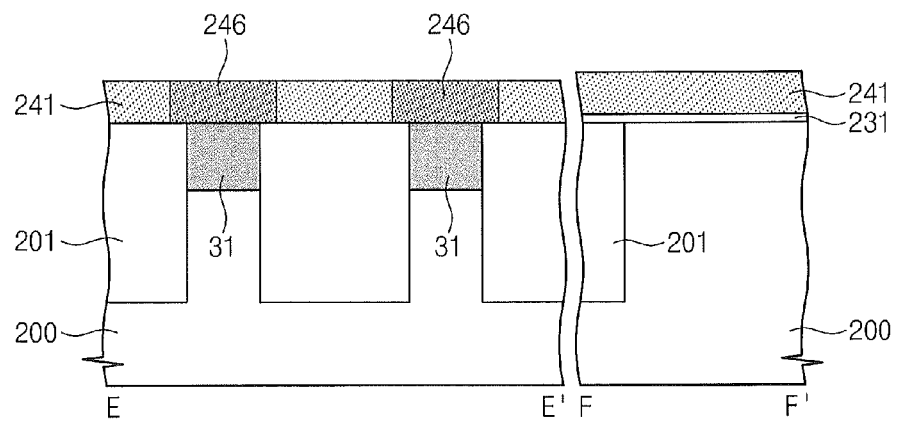

Referring to FIGS. 25, 31A, and 31B, second semiconductor patterns 246 may be formed to fill the through-holes 12, respectively. For example, the second semiconductor patterns 246 may be formed of silicon doped with dopants. After the mask pattern 213 is removed, a second semiconductor layer may be formed to fill the through-holes 12. The second semiconductor layer may be planarized to form the second semiconductor patterns 246. The second semiconductor patterns 246 may be doped with the same dopants as the first dopant regions 31 in-situ.

Figure 32A:
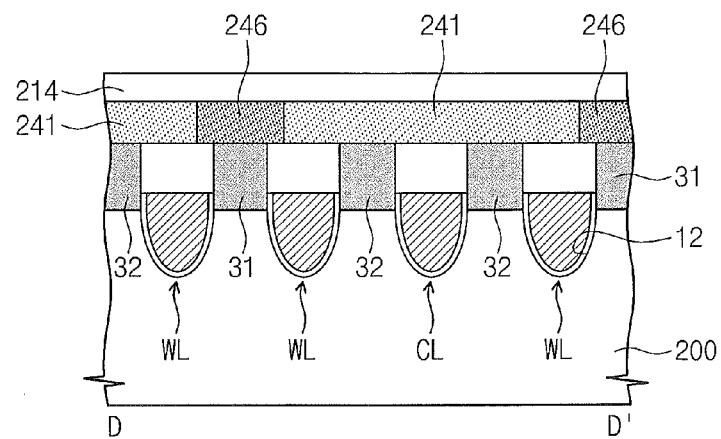
Figure 32B:
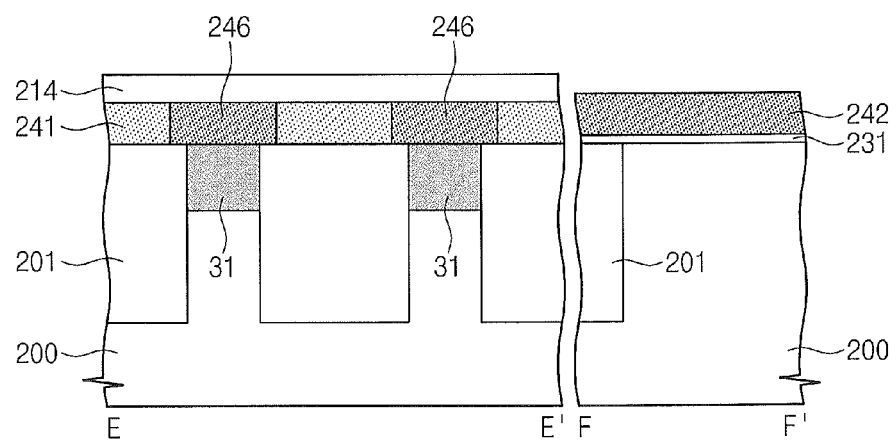

Referring to FIGS. 25, 32A, and 32B, a mask pattern 214 may be formed to cover the cell array region CAR, and then a dopant ion implantation process may be performed on the first semiconductor layer 241 on the peripheral circuit region PCR. If a transistor of the peripheral circuit region PCR is a PMOS transistor, the first semiconductor layer 242 implanted with the dopants may be p-type on the peripheral circuit region PCR. If the transistor of the peripheral circuit region PCR is an NMOS transistor, the first semiconductor layer 242 implanted with the dopants may be n-type, on the peripheral circuit region PCR. However, the inventive concept is not limited thereto.

Figure 33A:
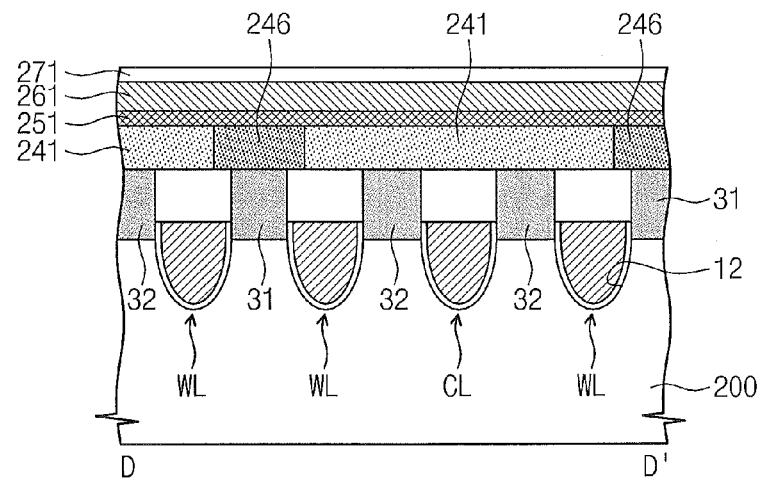
Figure 33B:
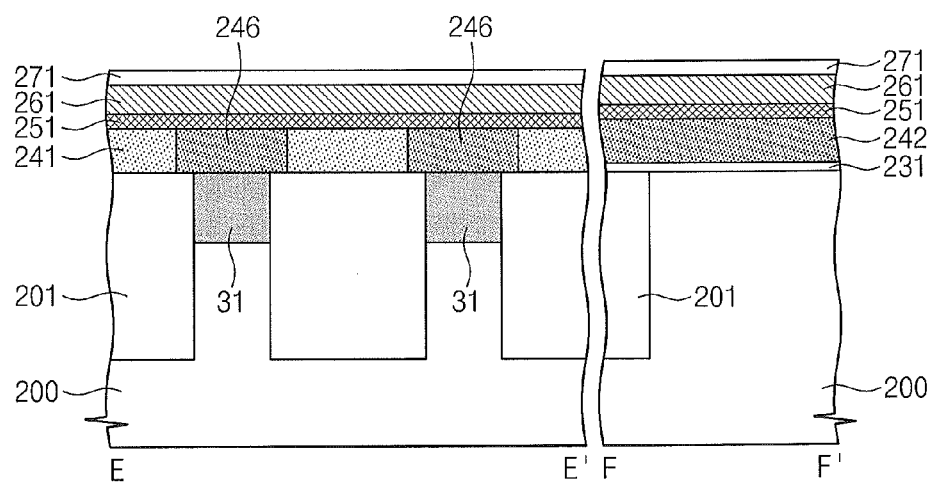

Referring to FIGS. 25, 33A, and 33B, the mask pattern 214 may be removed. Subsequently, an ohmic barrier layer 251, a metal layer 261, and a capping layer 271 may be sequentially formed on the cell array region CAR and the peripheral circuit region PCR. The ohmic barrier layer 251 may include a metal-silicon nitride. In some embodiments, the metal-silicon nitride may include at least one of titanium-silicon nitride (TiSiN), tantalum-silicon nitride (TaSiN), and tungsten-silicon nitride (WSiN).

The metal layer 261 may include at least one of tungsten (W), titanium (Ti), and tantalum (Ta). The capping layer 271 may include at least one of silicon oxide, silicon nitride, and silicon oxynitride. Each of the metal layer 261 and the capping layer 271 may be formed by a sputtering process or a CVD process.

Figure 34A:
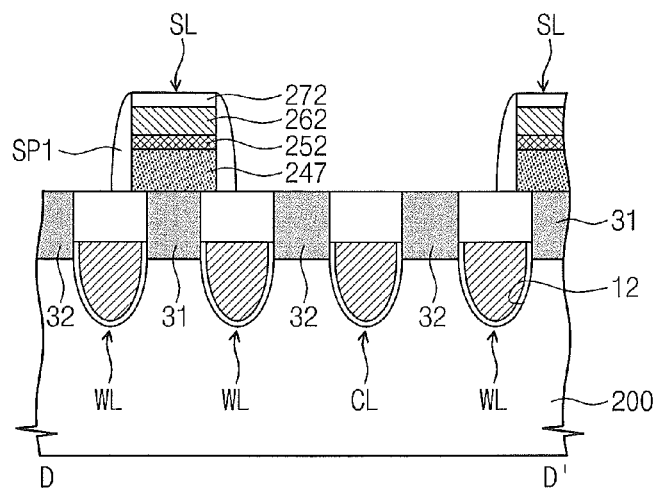
Figure 34B:
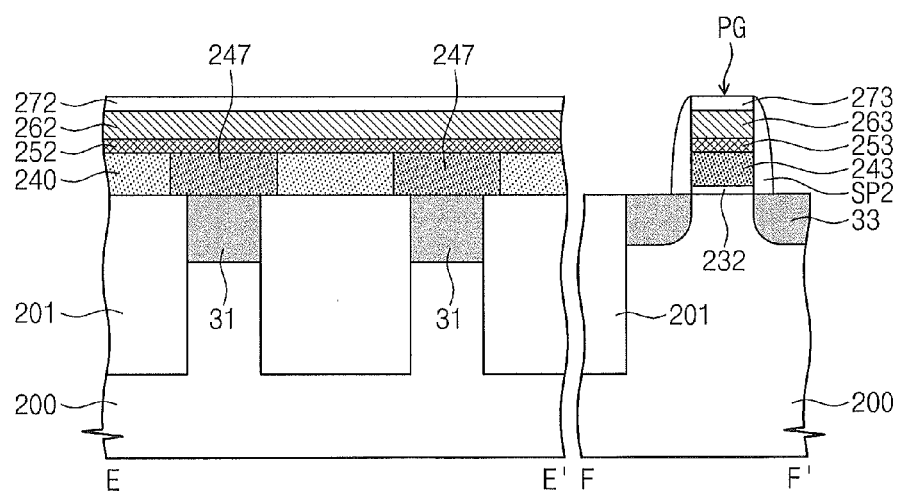

Referring to FIGS. 25, 34A, and 34B, the capping layer 271, the metal layer 261, the ohmic barrier layer 251, the first semiconductor layer 241 and 242, and the second semiconductor patterns 246 may be patterned to form conductive lines on the cell array region CAR and a peripheral gate structure PG on the peripheral circuit region PCR. The conductive lines may be source lines SL of the semiconductor device. Each of the source lines SL may include a plurality of first conductive patterns 247 respectively connected to the first dopant regions 31, an ohmic barrier pattern 252, a second conductive pattern 262, and a capping pattern 272. The ohmic barrier pattern 252, the second conductive pattern 262, and the capping pattern 272 may be sequentially stacked on the plurality of first conductive patterns 247 in each of the source lines SL.

The first semiconductor layer 241 on the cell array region CAR may be divided into first semiconductor patterns 240 spaced apart from each other by the patterning process. The first conductive patterns 247 may be disposed between the first semiconductor patterns 240. In other words, the first conductive patterns 247 and the first semiconductor patterns 240 in each of the source lines SL may be alternately arranged in a longitudinal direction of the source line SL. The peripheral gate structure PG may include a gate insulating layer 232, a first conductive pattern 243, an ohmic barrier pattern 253, a second conductive pattern 263, and a capping pattern 273 which are sequentially stacked on the substrate 200. A first spacer SP1 and a second spacer SP1 may form sidewalls of each of the source lines SL and a sidewall of the peripheral gate structure PG, respectively. Third dopant regions 33 may be formed in the second active region AR2 at both sides of the peripheral gate structure PG, respectively. Dopant ions of the same conductivity type as the dopants of the first conductive pattern 143 may be implanted into the second active region AR2 to form the third dopant regions 33.

Figure 35A:
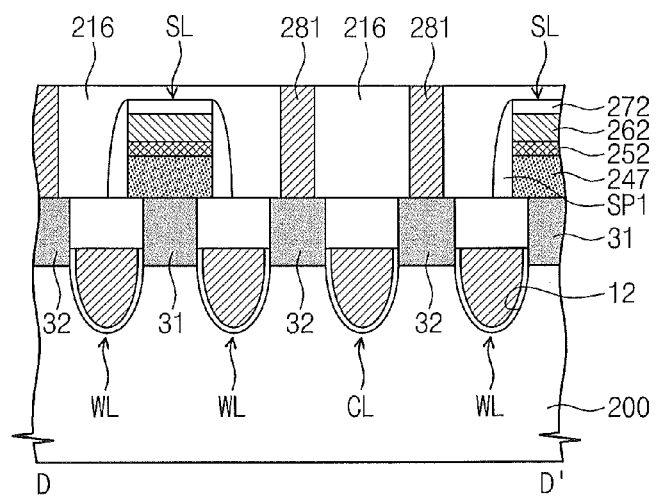
Figure 35B:
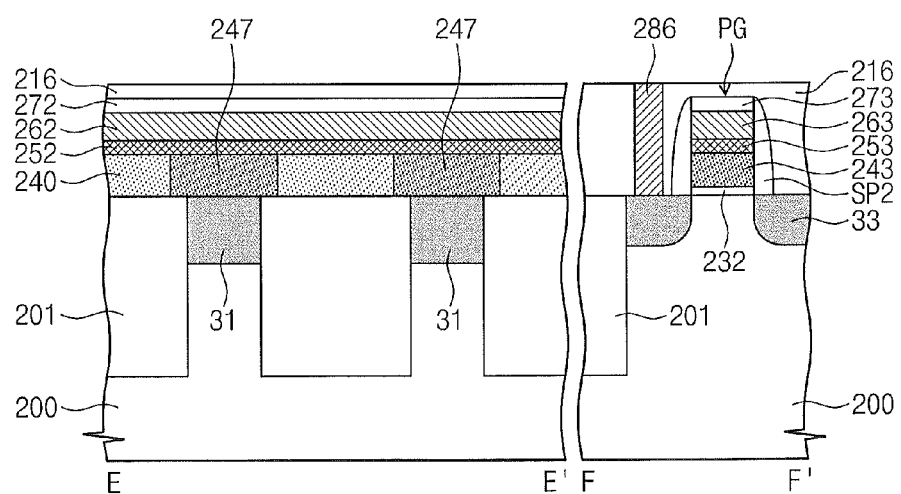

Referring to FIGS. 25, 35A, and 35B, a first interlayer insulating layer 216 may be formed to cover the source lines SL and the peripheral gate structure PG, and then first contacts 281 may be formed to penetrate the first interlayer insulating layer 216. The first contacts 281 may be connected to the second dopant regions 32, respectively. The first contacts 281 may be formed simultaneously with a second contact 286 connected to the third dopant region 33 of the peripheral circuit region PCR. The contacts 281 and 286 may include at least one of a metal, a conductive metal nitride, and doped silicon. The contacts 281 and 286 may be formed using a sputtering process or a CVD process.

Figure 36A:
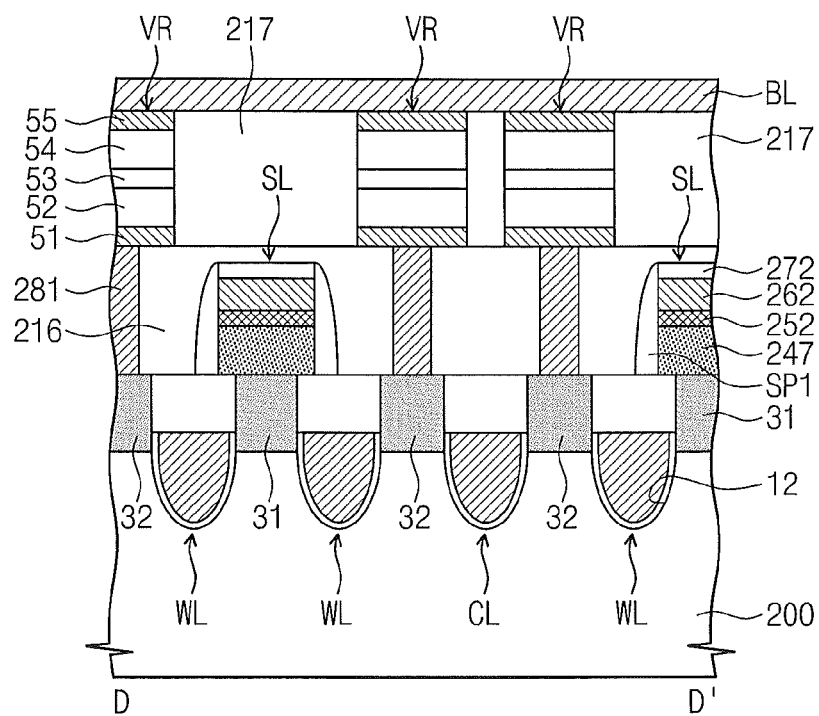
Figure 36B:
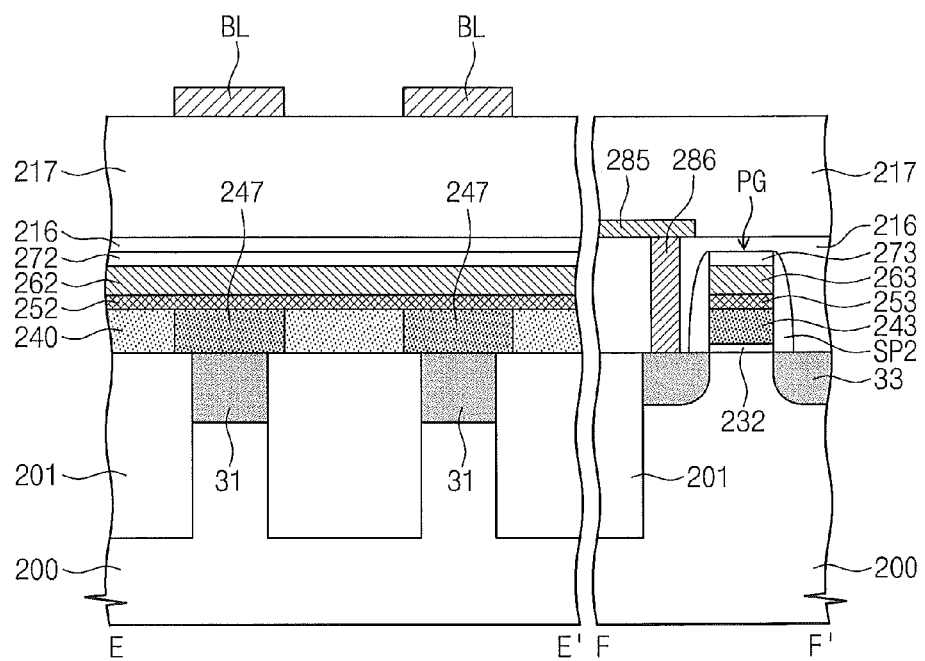

Referring to FIGS. 25, 36A, and 36B, data storage parts VR may be formed on the first contacts 281, respectively. Each of the data storage parts VR may include a magnetic tunnel junction (MTJ). In some embodiments, each of the data storage parts VR may include a first electrode 51, a reference magnetic layer 52, a tunnel barrier layer 53, a free layer 54, and a second electrode 55 which are sequentially stacked on the first contact 281. The data storage parts VR may be formed in a second interlayer insulating layer 217.

The first and second electrodes 51 and 55 may include a conductive material having low reactivity. The first and second electrodes 51 and 55 may include a conductive metal nitride. In some embodiments, the first and second electrodes 51 and 55 may include at least one of titanium nitride, tantalum nitride, tungsten nitride, and titanium-aluminum nitride.

If the data storage part VR includes a horizontal MTJ, the reference magnetic layer 52 may include a pinning layer and a pinned layer. The pinning layer may include an anti-ferromagnetic material. In some embodiments, the pinning layer may include at least one of PtMn, IrMn, MnO, MnS, MnTe, MnF2, FeCl2, FeO, CoCl2, CoO, NiCl2, NiO, and Cr. The pinned layer may have a magnetization direction fixed by the pinning layer. The pinned layer may include a ferromagnetic material. In some embodiments, the pinned layer may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer 53 may have a thickness less than a spin diffusion distance. The tunnel barrier layer 53 may include a non-magnetic material. In some embodiments, the tunnel barrier layer 53 may include at least one of magnesium oxide (MgO), titanium oxide (TiO), aluminum oxide (AlO), magnesium-zinc oxide (MgZnO), magnesium-boron oxide (MgBO), titanium nitride (TiN), and vanadium nitride (VN).

The free layer 54 may include a material having a changeable magnetization direction. The magnetization direction of the free layer 54 may be changed by electrical/magnetic factors provided from the outside and/or the inside of a magnetic memory cell. The free layer 54 may include a ferromagnetic material including at least one of cobalt (Co), iron (Fe), and nickel (Ni). In some embodiments, the free layer 54 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

Bit lines BL may be formed on the data storage parts VR. The bit lines BL may extend in the x-axis direction and be connected to the data storage parts VR. The bit lines BL may include at least one of a metal, a conductive metal nitride, and a doped semiconductor material. The bit lines BL may be formed using a sputtering process or a CVD process.

A semiconductor device according to embodiments is described with reference to FIGS. 25, 36A, and 36B. A substrate 200 may include a cell array region CAR and a peripheral circuit region PCR. The substrate 200 may be a semiconductor substrate formed of, for example, silicon, germanium, or silicon-germanium. The substrate 200 may include field isolation regions 201 defining first active regions AR1 in the cell array region CAR and a second active region PCR in the peripheral circuit region PCR. The first active regions AR1 may have line-shapes extending in the x-axis direction and spaced apart from each other in the y-direction.

Gate structures buried in the substrate 200 may be provided in the cell array region CAR. The gate structures may include word lines WL and separation gate structures CL. In a plan view, a pair of the word lines WL may be disposed between a pair of separation gate structures CL adjacent to each other. The word lines WL may have substantially the same structure as the separation gate structures CL.

The separation gate structures CL may be provided for electrical insulation between memory cells. In an operation (e.g., a read operation and a write operation) of the semiconductor device, a ground voltage or a negative voltage may be applied to the separation gate structures CL. In some embodiments, the voltage applied to the separation gate structures CL may be substantially equal to a voltage applied to unselected word lines. In other embodiments, the voltage applied to the separation gate structures CL may be smaller than the voltage applied to unselected word lines. The separation gate structures CL may be connected to each other by a connection conductive pattern GL, so as to be in an equipotential state.

First dopant regions 31 may be provided between the word lines WL and second dopant regions 32 may be provided between the word line WL and the separation gate structure CL. The first dopant regions 31 may be arranged in the y-axis direction and be spaced apart from each other between the word lines WL. The second dopant regions 32 may be arranged in the y-axis direction and be spaced apart from each other between the word line WL and the separation gate structure CL. The dopant regions 31 and 32 may be doped with dopants of a conductivity type different from a conductivity type of the substrate 200.

Conductive lines may be provided on the cell array region CAR. The conductive lines may be connected to the first dopant regions 31 and extend in the x-axis direction. The conductive lines may be source lines SL connected to the first dopant regions 31. In some embodiments, the source lines SL may be applied with 1V or a source voltage of a ground voltage when the semiconductor device is operated. A peripheral gate structure PG may be provided on the peripheral circuit region PCR. Each of the source lines SL and the peripheral gate structure PG may include a first conductive pattern, a second conductive pattern, and an ohmic barrier pattern disposed between the first and second conductive patterns. In some embodiments, each of the source lines SL may include first conductive patterns 247 respectively connected to the first dopant regions 31, an ohmic barrier pattern 252, a second conductive pattern 262, and a capping pattern 272. The ohmic barrier pattern 252, the second conductive pattern 262, and the capping pattern 272 may be sequentially stacked on the plurality of first conductive patterns 247 in each of the source lines SL. The peripheral gate structure PG may include a gate insulating layer 232, a first conductive pattern 243, an ohmic barrier pattern 253, a second conductive pattern 263, and a capping pattern 273 which are sequentially stacked on the substrate 200. A first spacer SP1 and a second spacer SP1 may be formed a sidewall of each of the source lines SL and a sidewall of the peripheral gate structure PG, respectively.

Each of the source lines SL may further include separation patterns disposed between the first conductive patterns 247. For example, the separation patterns may be first semiconductor patterns 240. The first semiconductor patterns 240 may include undoped poly-silicon. A bottom surface of the ohmic barrier pattern 252 on the cell array region CAR may extend in the x-axis direction and be in contact with the first conductive patterns 247 and the first semiconductor patterns 240 alternately arranged in the x-axis direction.

Data storage parts may be provided to be electrically connected to the second dopant regions 32, respectively. If the semiconductor device according to some embodiments is a magnetic random access memory (MRAM) device, each of the data storage parts VR connected to the second dopant regions 32 may include a magnetic tunnel junction (MTJ). In some embodiments, each of the data storage parts VR may include a first electrode 51, a reference magnetic layer 52, a tunnel barrier layer 53, a free layer 54, and a second electrode 55 which are sequentially stacked on each of first contacts 281. The data storage parts VR may be disposed on a first interlayer insulating layer 216. Bit lines BL may be provided on the data storage parts VR. The bit lines BL may extend in the x-axis direction and be connected to the data storage parts VR.

The semiconductor devices according to the inventive concept are not limited to the DRAM device or the MRAM device. The semiconductor devices according to the inventive concept may include a phase change random access memory (PRAM) device, a ferroelectric random access memory (FRAM) device, and/or a resistive random access memory (RRAM) device. In some embodiments, if the semiconductor device according to the inventive concept is the PRAM device, each of the data storage parts VR may include a phase change material layer disposed between the electrodes 51 and 52, instead of the reference magnetic layer 52, the tunnel barrier layer 53, and the free layer 54. In some embodiments, if the semiconductor device according to the inventive concept is the FRAM device, each of the data storage parts VR may include a ferroelectric layer disposed between the electrodes 51 and 55, instead of the reference magnetic layer 52, the tunnel barrier layer 53, and the free layer 54.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

Figure 37:
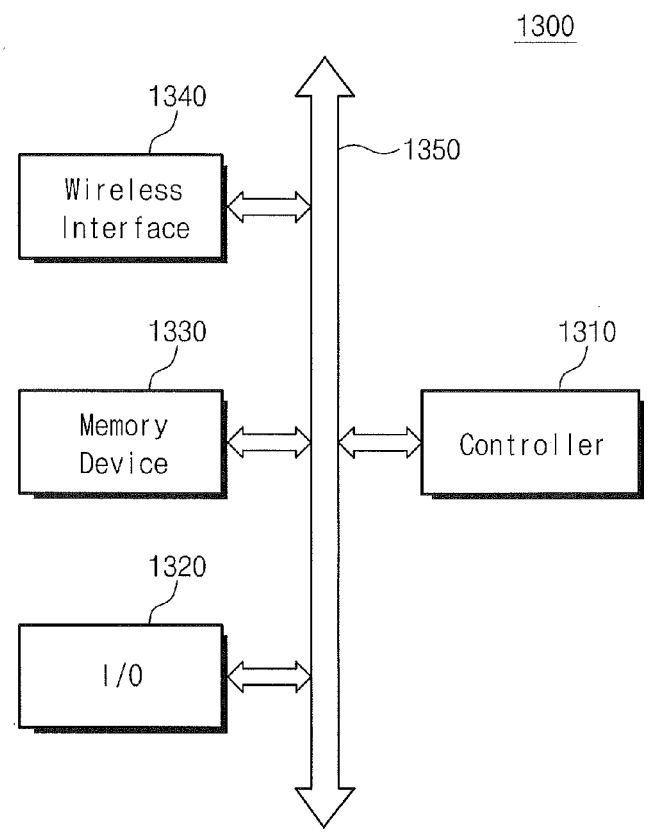
FIG. 37 is a schematic block diagram illustrating electronic devices including semiconductor devices according to embodiments of the inventive concept.

FIG. 37 is a schematic block diagram illustrating an example of electronic devices including semiconductor devices according to embodiments of the inventive concept.

Referring to FIG. 37, an electronic device 1300 according to an embodiment of the inventive concept may be one of a personal digital assistant (PDA), a laptop computer, a portable computer, a web tablet, a wireless phone, a mobile phone, a digital music player, a cable or wireless electronic device, and an electronic device including any combination thereof. The electronic device 1300 may include a controller 1310, an input/output (I/O) unit 1320 such as a keypad, a key board, and/or a display, a memory device 1330, and a wireless interface unit 1340 which communicate with each other through the data bus 1350.

The controller 1310 may include at least one of a microprocessor, a digital signal processor, a microcontroller or other logic devices. The other logic devices may have a similar function to any one of the microprocessor, the digital signal processor and the microcontroller. The memory device 1330 may store user's data and/or commands. The memory device 1330 may include at least one of the semiconductor devices according to the embodiments described herein. The electronic device 1300 may transmit data to a wireless communication network using a radio frequency (RF) signal and/or receive data from the network through the wireless interface unit 1340. For example, the wireless interface unit 1340 may include an antenna or a wireless transceiver. The electronic device 1300 may be used in a communication interface protocol such as CDMA, GSM, NADC, E-TDMA, WCDMA, and/or CDMA2000.

Figure 38:
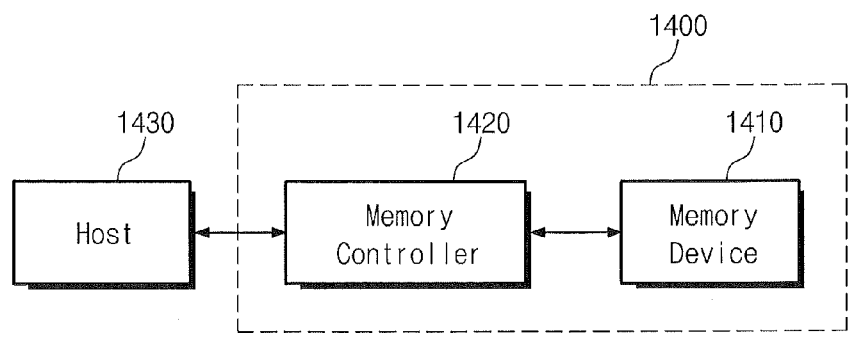
FIG. 38 is a schematic block diagram illustrating memory systems including semiconductor devices according to embodiments of the inventive concept.

FIG. 38 is a schematic block diagram illustrating an example of memory systems including semiconductor devices according to embodiments of the inventive concept.

Referring to FIG. 38, the semiconductor devices according to embodiments of the inventive concept may be used for realizing a memory system 1400. The memory system 1400 may include a memory device 1410 and a memory controller 1420 for storing data. The memory controller 1420 may read data stored in the memory device 1410 or write data to the memory device 1410 in response to read/write request of a host 1430. The memory controller 1420 may constitute an address mapping table for mapping an address provided from the host 1430 (e.g., a mobile device or a computer system) into a physical address of the memory device 1410. The memory device 1410 may include at least one of the semiconductor devices according to the embodiments described herein.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed:

1. A semiconductor memory device comprising:
a first conductive line crossing over a field isolation region and crossing over an active region of the device, the first conductive line including a first conductive pattern being doped, a second conductive pattern, and a metal-silicon-nitride pattern between the first and second conductive patterns and configured to provide a contact at a lower boundary of the metal-silicon-nitride pattern with the first conductive pattern and configured to provide a diffusion barrier at an upper boundary of the metal-silicon-nitride pattern with the second conductive pattern, wherein the first conductive line crosses over the field isolation region and over the active region in a cell array region of the device, the device further comprising:
a second conductive line crossing over a field isolation region and over an active region in a peripheral region of the device, the second conductive line including a third conductive pattern being doped, and a fourth conductive pattern, and a metal-silicon-nitride pattern between the third and fourth conductive patterns and configured to provide a contact at a lower boundary of the metal-silicon-nitride pattern with the third conductive pattern and a diffusion barrier at an upper boundary of the metal-silicon-nitride pattern with the fourth conductive pattern in the peripheral region.

2. The device of claim 1 wherein the first conductive line comprises a bit line and the second conductive line comprises a peripheral gate structure.

3. The device of claim 1 wherein the metal-silicon-nitride pattern includes a metal silicide comprising the contact.

4. The device of claim 3 wherein the contact comprises an ohmic contact.

5. The device of claim 1 wherein the metal-silicon-nitride pattern comprises a total thickness of about 30 Angstroms to about 70 Angstroms and the first conductive pattern comprises a total thickness of about 200 Angstroms to about 400 Angstroms.

6. The device of claim 5 wherein the first conductive line comprises a total thickness less than about 800 Angstroms.

7. The device of claim 6 wherein the total thickness of the first conductive line is greater than about 550 Angstroms.

8. The device of claim 7 wherein the total thickness of the first conductive pattern is about 350 Angstroms.

9. The device of claim 8 wherein the second conductive pattern comprises a total thickness of about 300 Angstroms.

10. The device of claim 1 wherein the metal-silicon-nitride pattern comprises a total thickness of about 10% to about 25% of a total thickness of the first conductive pattern.

11. The device of claim 1 wherein a total thickness of the metal-silicon-nitride pattern is less than a total thickness of the second conductive pattern, which is less than a total thickness of the first conductive pattern.

12. The device of claim 1 wherein the metal-silicon-nitride pattern comprises a silicon concentration of at least about 10 atm % measured over a total thickness of the metal-silicon-nitride pattern.

13. The device of claim 12 wherein the silicon concentration comprises a first concentration of about 10 atm % to about 30 atm % measured adjacent the upper boundary and comprises a second concentration of about 30 atm % to about 50 atm % measured adjacent the lower boundary.

14. The device of claim 13 wherein the silicon concentration changes from the first concentration to the second concentration throughout the metal-silicon-nitride pattern.

15. The device of claim 1 wherein the metal-silicon-nitride pattern comprises silicon-nitride layers interspersed with metal-nitride layers.

16. The device of claim 1 wherein the metal-silicon-nitride pattern comprises a TiSiN pattern.

17. The device of claim 16 wherein the TiSiN pattern comprises SiN layers interspersed with TiN layers.

18. The device of claim 1 wherein the semiconductor memory device comprises a DRAM and the first conductive line comprises a bit line included in a BCAT in a cell array region of the DRAM.

19. The device of claim 1 wherein the semiconductor memory device comprises an MRAM.

20. The device of claim 1 wherein the semiconductor memory device comprises a vertical channel DRAM.

21. A semiconductor memory device comprising:
a first conductive line crossing over a field isolation region and crossing over an active region of the device, the first conductive line including a first conductive pattern being doped, a second conductive pattern, and a metal-silicon-nitride pattern between the first and second conductive patterns and configured to provide a contact at a lower boundary of the metal-silicon-nitride pattern with the first conductive pattern and configured to provide a diffusion barrier at an upper boundary of the metal-silicon-nitride pattern with the second conductive pattern, wherein a crystal structure in the metal-silicon-nitride pattern comprises a fine crystal structure including fine metal-nitride sub-grains having spaces therebetween and silicon-nitride in the spaces.

22. A semiconductor memory device comprising:
a first conductive line crossing over a field isolation region and crossing over an active region of the device, the first conductive line including a first conductive pattern being doped, a second conductive pattern, and a single layer metal-silicon-nitride pattern between the first and second conductive patterns and configured to provide a contact at a lower boundary of the single layer metal-silicon-nitride pattern with the first conductive pattern and configured to provide a diffusion barrier at an upper boundary of the single layer metal-silicon-nitride pattern with the second conductive pattern, wherein a silicon concentration in the single layer metal-silicon-nitride pattern progressively increases from the upper boundary to the lower boundary.

23. The device of claim 22 wherein the single layer metal-silicon-nitride pattern comprises a total thickness of about 30 Angstroms to about 70 Angstroms and the first conductive pattern comprises a total thickness of about 200 Angstroms to about 400 Angstroms.

24. The device of claim 22 wherein the single layer metal-silicon-nitride pattern comprises a total thickness of about 10% to about 25% of a total thickness of the first conductive pattern.

25. The device of claim 22 wherein a total thickness of the single layer metal-silicon-nitride pattern is less than a total thickness of the second conductive pattern, which is less than a total thickness of the first conductive pattern.

* * * * *